United States Patent
Choi et al.

(10) Patent No.: US 9,184,139 B2
(45) Date of Patent: Nov. 10, 2015

(54) SEMICONDUCTOR DEVICE AND METHOD OF REDUCING WARPAGE USING A SILICON TO ENCAPSULANT RATIO

(71) Applicant: STATS ChipPAC, Ltd., Singapore (SG)

(72) Inventors: Won Kyoung Choi, Singapore (SG); Pandi C. Marimuthu, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 73 days.

(21) Appl. No.: 14/109,313

(22) Filed: Dec. 17, 2013

(65) Prior Publication Data
US 2015/0171024 A1    Jun. 18, 2015

(51) Int. Cl.
| | | |
|---|---|---|
| H01L 21/50 | (2006.01) |
| H01L 21/48 | (2006.01) |
| H01L 21/44 | (2006.01) |
| H01L 23/00 | (2006.01) |
| H01L 21/56 | (2006.01) |
| H01L 21/78 | (2006.01) |
| H01L 21/768 | (2006.01) |
| H01L 23/31 | (2006.01) |
| H01L 23/48 | (2006.01) |

(52) U.S. Cl.
CPC ............ *H01L 23/562* (2013.01); *H01L 21/561* (2013.01); *H01L 21/76802* (2013.01); *H01L 21/76877* (2013.01); *H01L 21/78* (2013.01); *H01L 23/3107* (2013.01); *H01L 23/481* (2013.01); *H01L 24/97* (2013.01); *H01L 2224/16225* (2013.01); *H01L 2224/32225* (2013.01); *H01L 2224/48091* (2013.01); *H01L 2224/73204* (2013.01); *H01L 2224/73265* (2013.01); *H01L 2924/15311* (2013.01)

(58) Field of Classification Search
CPC ..... H01L 23/562; H01L 21/561; H01L 21/78; H01L 21/76802; H01L 23/3107; H01L 23/481
USPC ......................................... 438/110, 113, 613
See application file for complete search history.

(56) References Cited

U.S. PATENT DOCUMENTS

| | | | |
|---|---|---|---|
| 7,553,752 B2 * | 6/2009 | Kuan et al. ..................... 438/613 |
| 2013/0147054 A1 | 6/2013 | Lin et al. |
| 2013/0175696 A1 | 7/2013 | Lin et al. |
| 2013/0187258 A1 * | 7/2013 | Lu et al. ......................... 257/621 |
| 2013/0200529 A1 | 8/2013 | Lin et al. |

* cited by examiner

*Primary Examiner* — Luan C Thai
(74) *Attorney, Agent, or Firm* — Robert D. Atkins; Patent Law Group: Atkins and Associates, P.C.

(57) ABSTRACT

A semiconductor device has a substrate including a base substrate material and a plurality of conductive vias formed partially though the substrate. A plurality of semiconductor die including a base semiconductor material is disposed over the substrate. A ratio of an encapsulant to a quantity of the semiconductor die is determined for providing structural support for the semiconductor die. An encapsulant is deposited over the semiconductor die and substrate. An amount of the encapsulant is selected based on the determined ratio or based on a total amount of the base substrate material and base semiconductor material. Channels are formed in the encapsulant by removing a portion of the encapsulant in a peripheral region of the semiconductor die. Alternatively, a side surface of the semiconductor die is partially exposed with respect to the encapsulant. A portion of the base substrate material is removed to expose the conductive vias.

25 Claims, 20 Drawing Sheets

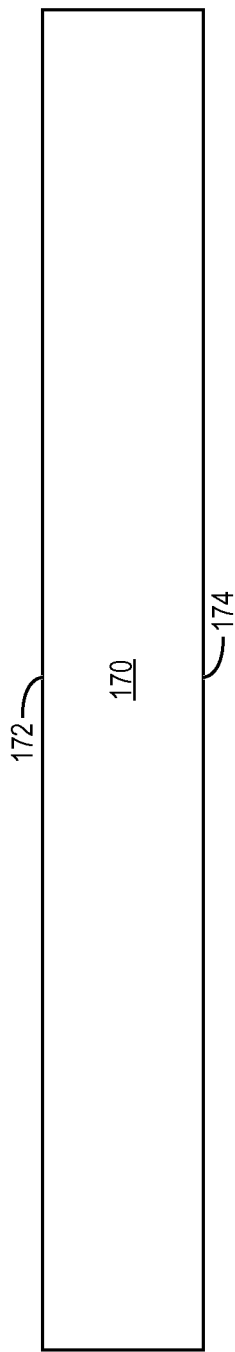
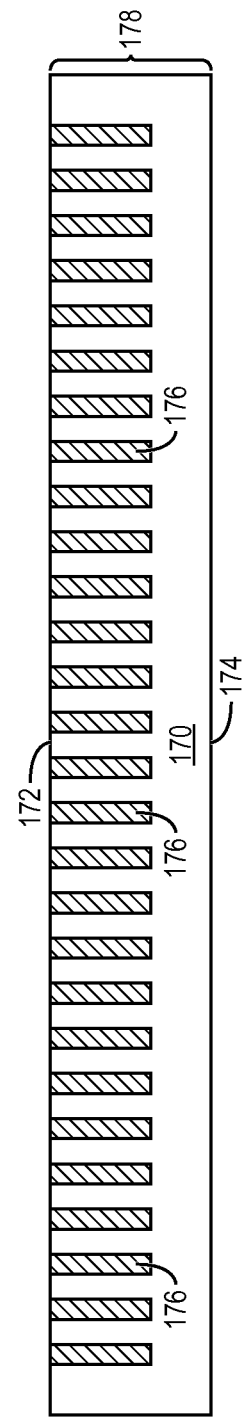

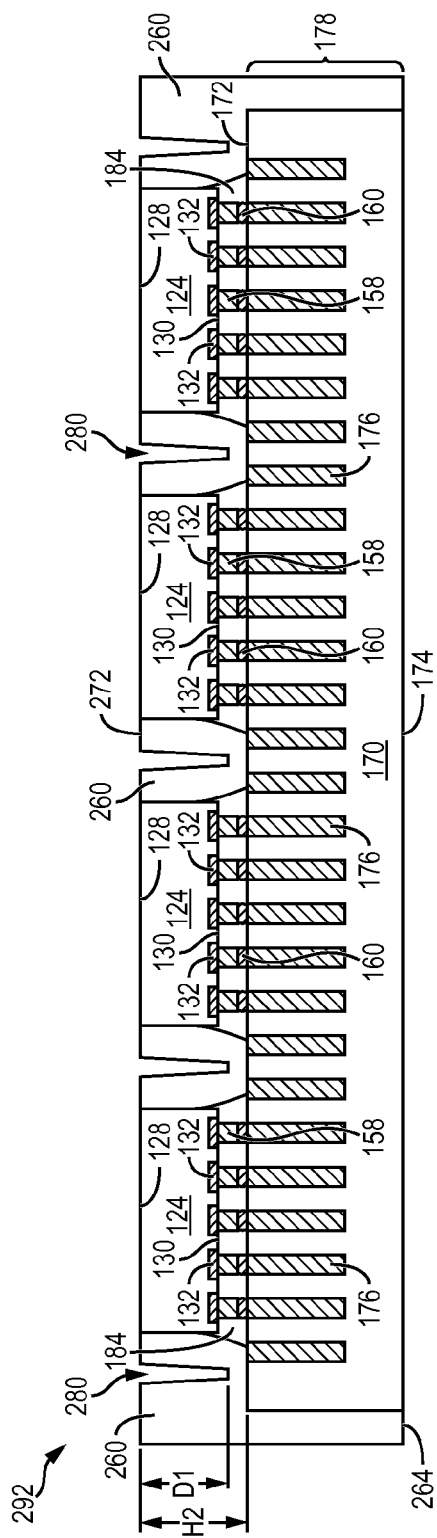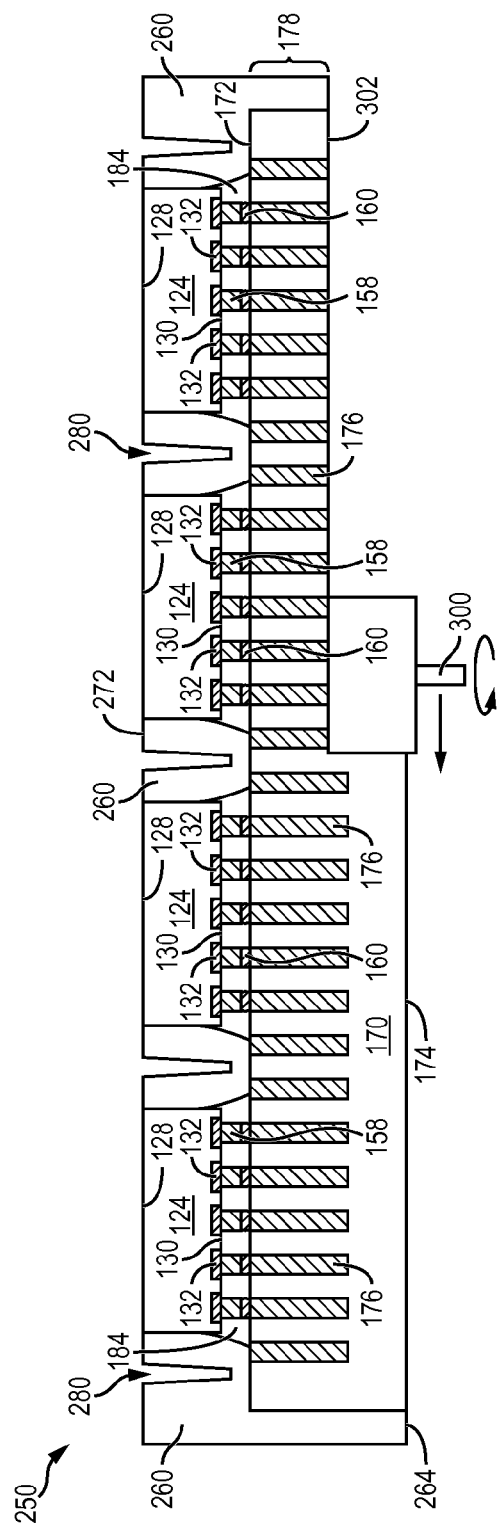

SEMICONDUCTOR DEVICE AND METHOD OF REDUCING WARPAGE USING A SILICON TO ENCAPSULANT RATIO

FIELD OF THE INVENTION

The present invention relates in general to semiconductor devices and, more particularly, to a semiconductor device and method of reducing warpage in a semiconductor package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the semiconductor material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to reduce cost and increase yield. Conventional semiconductor devices often contain semiconductor die mounted to semiconductor substrates. One type of semiconductor substrates contains conductive through silicon vias (TSV). A plurality of vias is formed through the semiconductor wafer. The vias are filled with conductive material to form the conductive TSV. To produce thinner semiconductor devices, thinner semiconductor die or thinner substrates may be used. A significant portion of semiconductor packaging costs are related to the costs associated with handling and processing thin semiconductor substrates. Temporary bonding of a substrate to a carrier for processing and debonding from the carrier is an expensive process, which increases the cost of the semiconductor device. Bonding and debonding to a temporary carrier adds steps to the manufacturing process and increases manufacturing time and cost.

Another source of decreased yield and increased manufacturing cost for semiconductor devices is excessive warpage. An encapsulant is deposited over the semiconductor die and substrate. The substrate and encapsulant are known to warp under thermal and mechanical stress. Warpage of the semiconductor device may result in misalignment of the interconnect structures used to connect the semiconductor die and substrate. Warpage can cause joint defects or failures and reduce reliability of the electrical connections across the semiconductor device. Warpage of the semiconductor device also reduces manufacturing yield and leads to increased cost.

SUMMARY OF THE INVENTION

A need exists to reduce warpage of semiconductor devices and to decrease the cost of handling semiconductor substrates. Accordingly, in one embodiment, the present invention is a method of making a semiconductor device comprising the steps of providing a substrate, disposing a plurality of semiconductor die over the substrate, determining a ratio of an encapsulant to a quantity of the semiconductor die for providing structural support for the semiconductor die, and depositing the encapsulant over the semiconductor die and substrate. An amount of the encapsulant is selected according to the determined ratio. The method further includes the step of removing a portion of the substrate.

In another embodiment, the present invention is a method of making a semiconductor device comprising the steps of providing a substrate including a base substrate material, disposing a semiconductor die including a base semiconductor material over the substrate, and depositing an encapsulant around the semiconductor die. An amount of the encapsulant is selected based on a total amount of the base substrate material and base semiconductor material. The method further includes the step of removing a portion of the substrate.

In another embodiment, the present invention is a semiconductor device comprising a substrate including a base substrate material. A semiconductor die including a base semiconductor material is disposed over the substrate. An encapsulant is deposited around the semiconductor die. An amount of the encapsulant is selected based on a total amount of base substrate material and base semiconductor material.

In another embodiment, the present invention is a semiconductor device comprising a substrate and a semiconductor die disposed over the substrate. An encapsulant is deposited around the semiconductor die. An amount of the encapsulant is selected based on a predetermined ratio of encapsulant to semiconductor die.

BRIEF DESCRIPTION OF THE DRAWINGS

FIGS. 4a-4l illustrate a process of forming a semiconductor device with reduced warpage;

FIGS. 6a-6k illustrate an alternative process of forming a semiconductor device with reduced warpage;

DETAILED DESCRIPTION OF THE DRAWINGS

Figure 1:
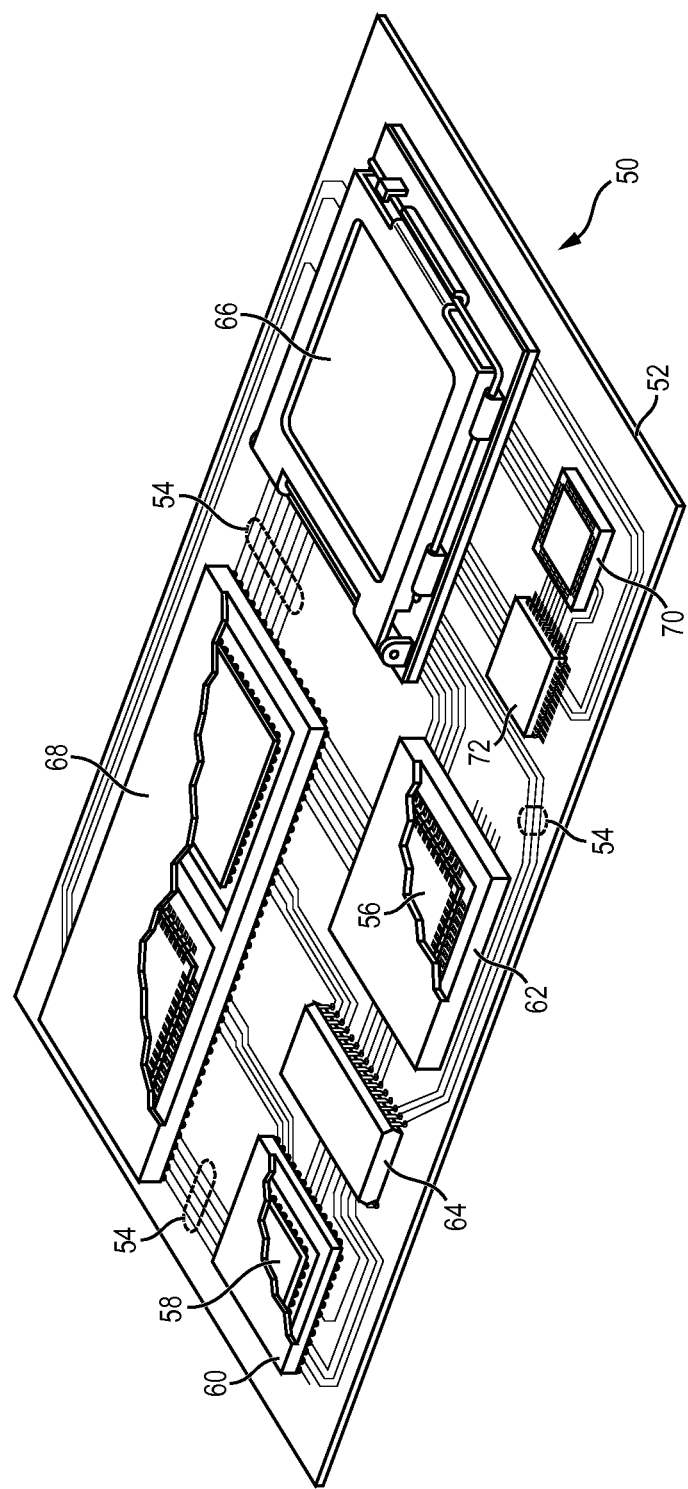
FIG. 1 illustrates a printed circuit board (PCB) with different types of packages mounted to the surface of the PCB.

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
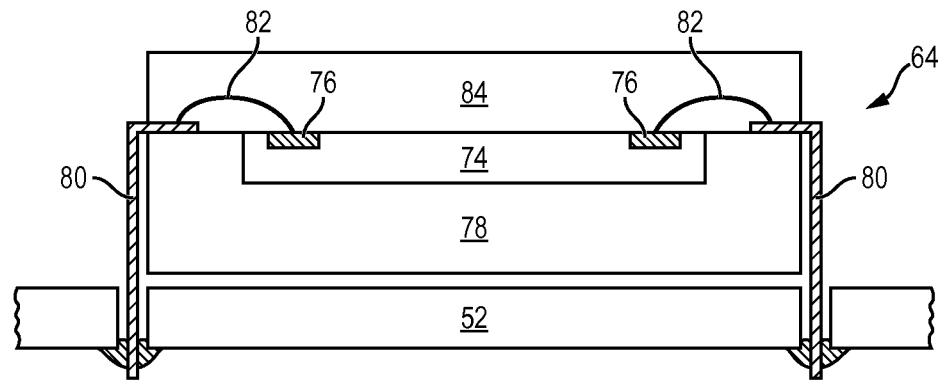
FIGS. 2a-2c illustrate further detail of the representative semiconductor packages mounted to the PCB.
Figure 2B:
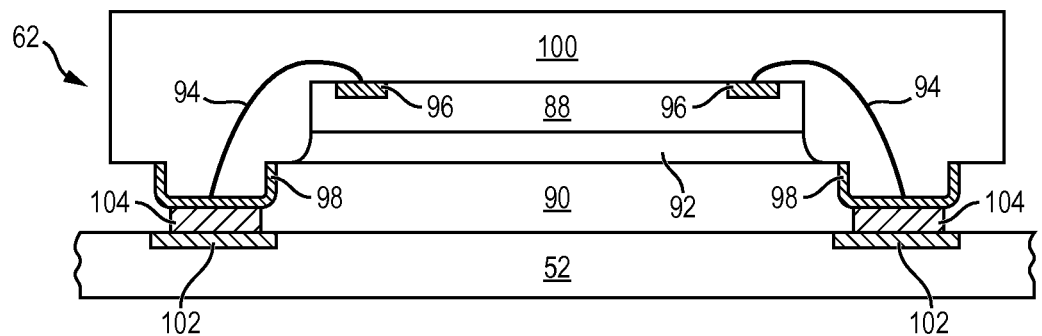
Figure 2C:
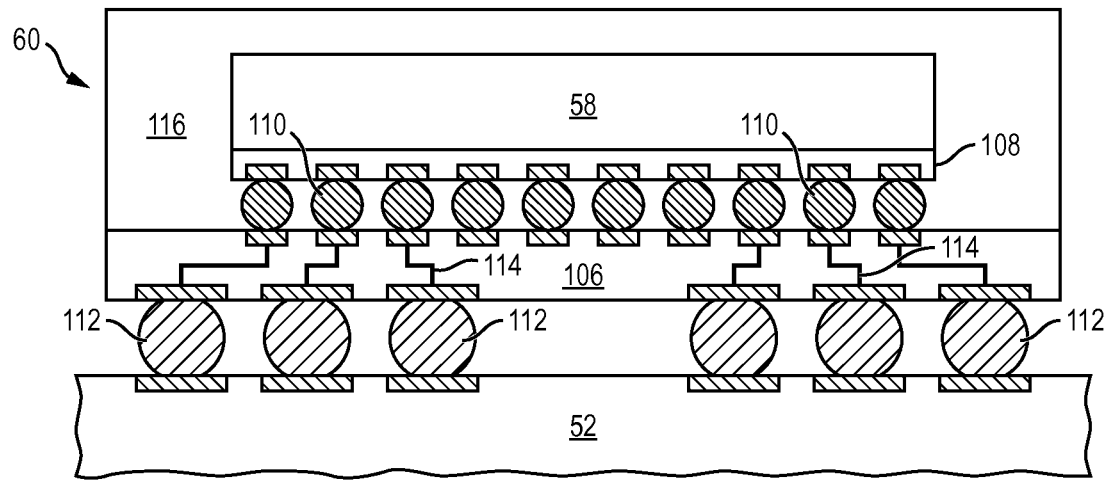

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
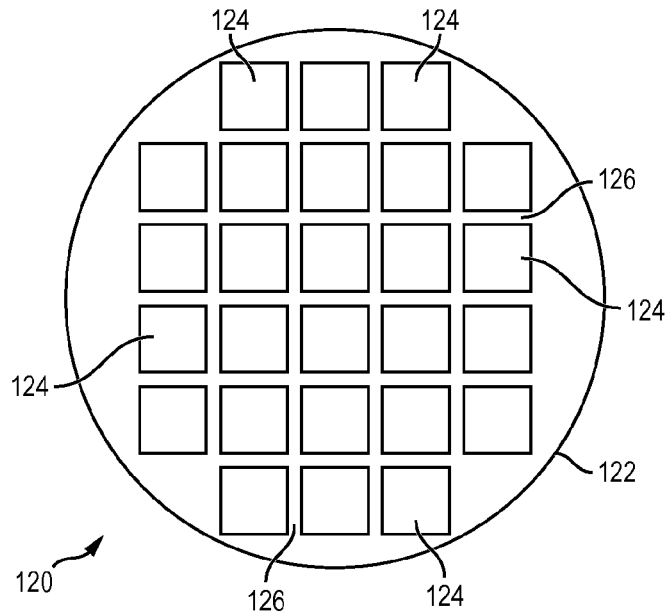
FIGS. 3a-3g illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In another embodiment, semiconductor wafer 120 has a width or diameter of 100-450 millimeters (mm).

Figure 3B:
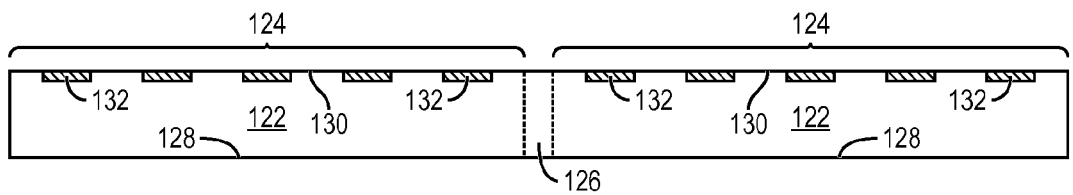

FIG. 3b shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Figure 3C:
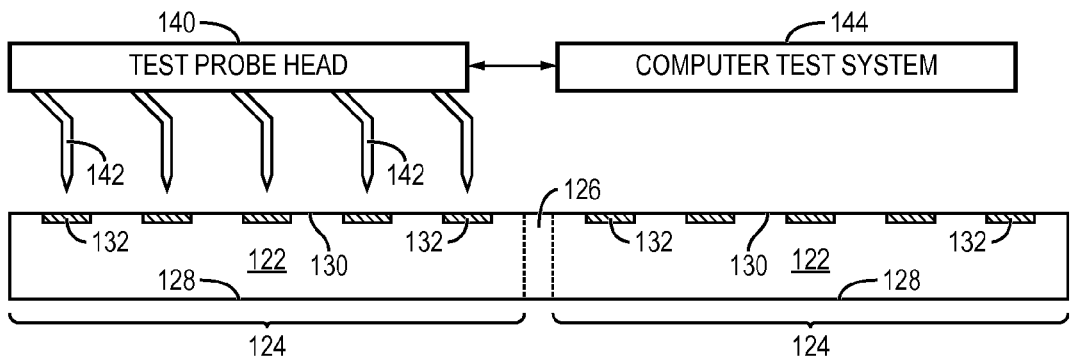

In FIG. 3c, semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters using a probe or other testing device. Test probe head 140 includes a plurality of probes 142. Probes 142 are used to make electrical contact with nodes or contact pads 132 on each semiconductor die 124 and provides electrical stimuli to the contact pads. Semiconductor die 124 responds to the electrical stimuli, which is measured by computer test system 144 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 3D:
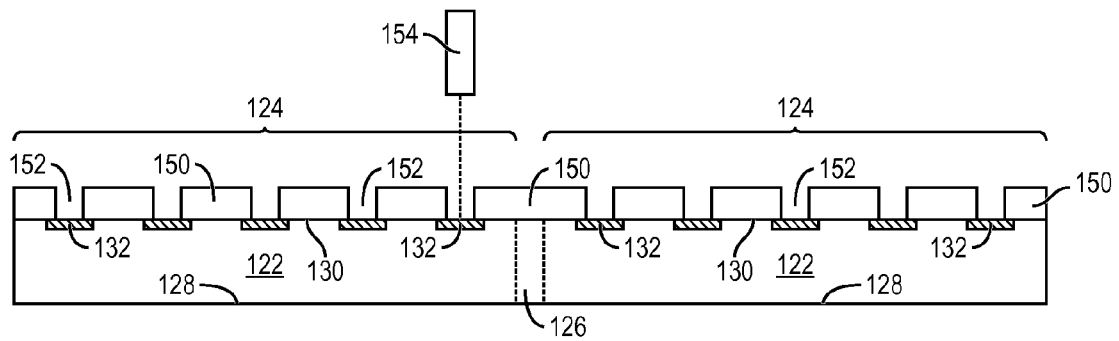

In FIG. 3d, a patterning or photoresist layer 150 is formed over active surface 130 and conductive layer 132 using printing, spin coating, or spray coating. In some embodiments that utilize an insulating layer for patterning, the insulating layer can include one or more layers of silicon dioxide (SiO2), silicon nitride (Si3N4), silicon oxynitride (SiON), tantalum pentoxide (Ta2O5), aluminum oxide (Al2O3), or other material having similar structural properties. A portion of photoresist layer 150 is exposed and removed by an etching process to form openings or vias 152 that extend down to and expose conductive layer 132. Alternatively, openings 152 are formed by laser direct ablation (LDA) using laser 154.

Figure 3E:
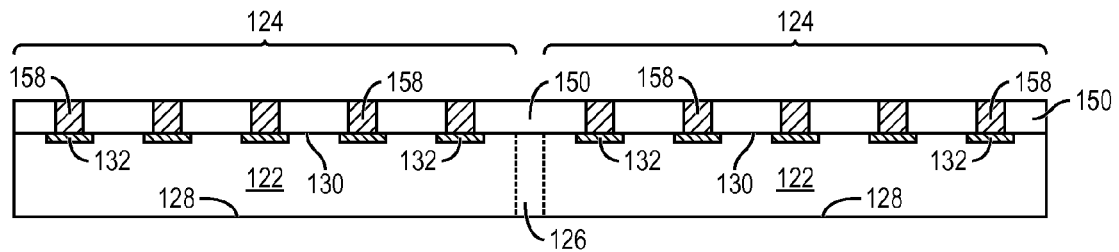

In FIG. 3e, an electrically conductive material is deposited into openings 152 over conductive layer 132 using a patterning and metal deposition process such as evaporation, screen printing, sputtering, electrolytic plating, or electroless plating to form conductive pillars or columns 158. The conductive material can be one or more layers of Al, Cu, Sn, titanium (Ti), Ni, Au, Ag, tungsten (W), or other suitable electrically conductive material. In one embodiment, the conductive material is deposited by Cu plating into openings 152 of photoresist layer 150. Conductive pillars 158 are electrically connected to conductive layer 132.

Figure 3F:
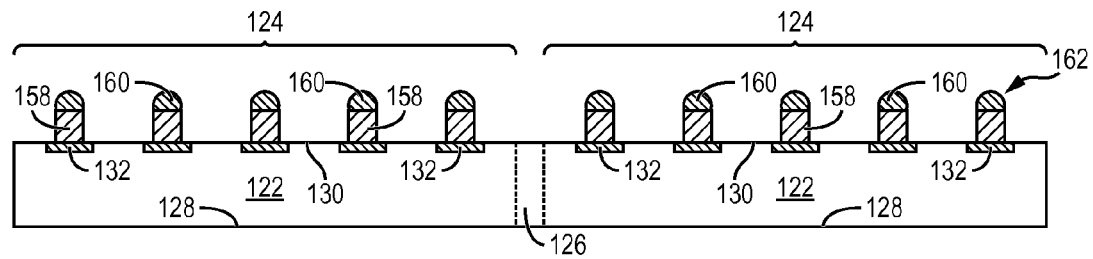

In FIG. 3f, the remaining portions of photoresist layers 150 are removed by a chemical stripping or etching process to leave conductive pillars 158 and to expose active surface 130 of semiconductor die 124. Conductive pillars 158 can have a cylindrical shape with a circular or oval cross-section, or conductive pillars 158 can have a cubic shape with a rectangular cross-section. In another embodiment, conductive pillars 158 can be implemented with stacked bumps or stud bumps.

An electrically conductive pre-solder or bump material is deposited over the exposed conductive pillars 158 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. In one embodiment, the bump material is reflowed by heating the material above the material's melting point to form pre-solder bumps or bump caps 160. In some applications, bumps 160 are reflowed a second time to improve electrical contact to conductive pillars 158. Bumps 160 can also be compression bonded to conductive pillars 158. Alternatively, the electrically conductive bump material is deposited prior to removing photoresist layer 150. Conductive pillars 158 and bump 160 together constitute a composite interconnect structure 162 with a non-fusible portion (conductive pillar 158) and a fusible portion (bump 160). Composite interconnect structures 162 represent one type of interconnect structure that can be formed over conductive layer 132 and semiconductor die 124. The interconnect structure can also use bond wire, bumps, conductive paste, stud bump, micro bump, or other electrical interconnect.

Figure 3G:
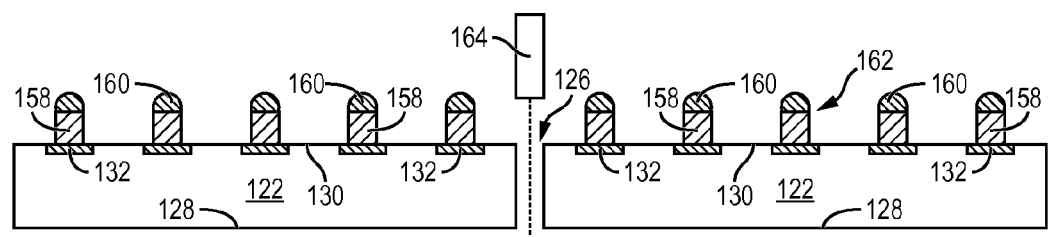

In FIG. 3g, semiconductor wafer 120 is singulated through saw street 126 using a saw blade or laser cutting tool 164 into individual semiconductor die 124. The individual semiconductor die 124 can be inspected and electrically tested for identification of KGD post singulation.

Figure 4C:
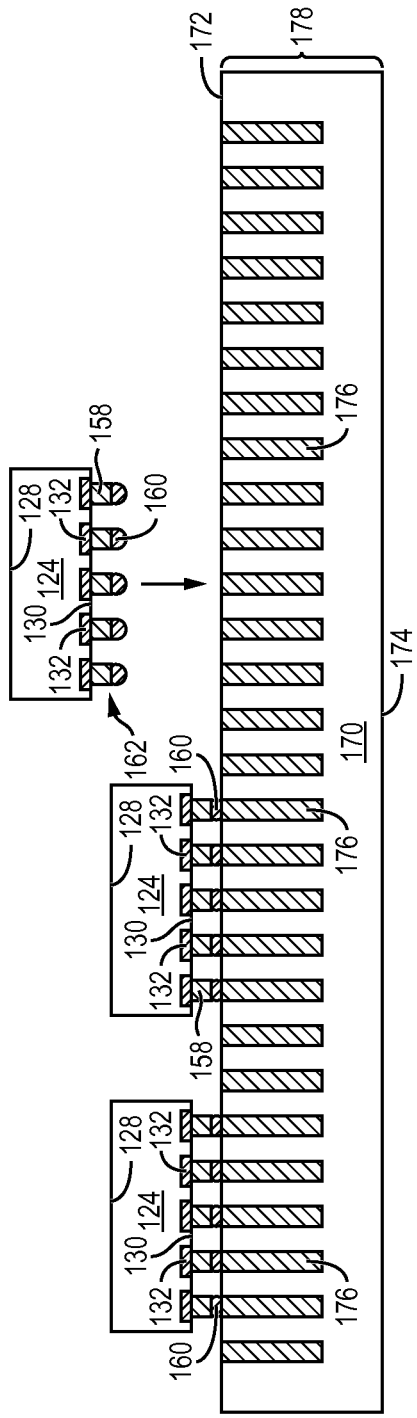

FIGS. 4a-4l illustrate, in relation to FIGS. 1 and 2a-2c, a process of forming a semiconductor device with reduced warpage. In FIG. 4a, a wafer-level substrate or interposer contains base substrate material 170 such as silicon, germanium, gallium arsenide, indium phosphide, silicon carbide, or other suitable material for structural support. Base substrate material 170 includes surface 172 and surface 174 opposite surface 172.

In FIG. 4b, a plurality of vias or openings is formed partially through base substrate material 170 using mechanical drilling, laser drilling, or deep reactive ion etching (DRIE). The vias extend vertically from surface 172 partially but not completely through base semiconductor material 170. The vias are filled with Al, Cu, Sn, Ni, Au, Ag, Ti, W, poly-silicon, or other suitable electrically conductive material using electrolytic plating, electroless plating process, or other suitable deposition process to form blind conductive through silicon vias (TSV) 176. Conductive TSV 176 provide z-direction vertical interconnect through TSV interposer 178.

Figure 4D:
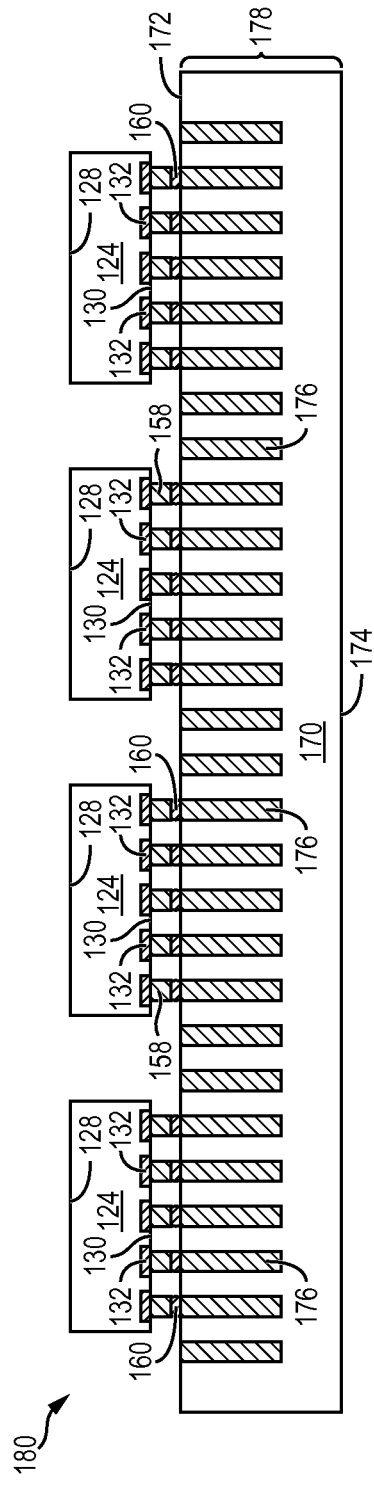

In FIG. 4c, semiconductor die 124 from FIGS. 3a-3g are mounted to TSV interposer 178 using a pick and place operation with active surface 130, conductive pillars 158, and bumps 160 oriented toward TSV interposer 178. Semiconductor die 124 are disposed over surface 172 of TSV interposer 178. FIG. 4d shows semiconductor die 124 mounted to TSV interposer 178. Conductive pillars 158 and bumps 160 are electrically connected to conductive TSV 176. Additional electrically conductive layers and insulating layers may be formed over TSV interposer 178 prior to mounting semiconductor die 124. Semiconductor die 124 are mounted to TSV interposer 178 to form a reconfigured or reconstituted wafer 180 as shown in FIG. 4d.

Figure 4E:
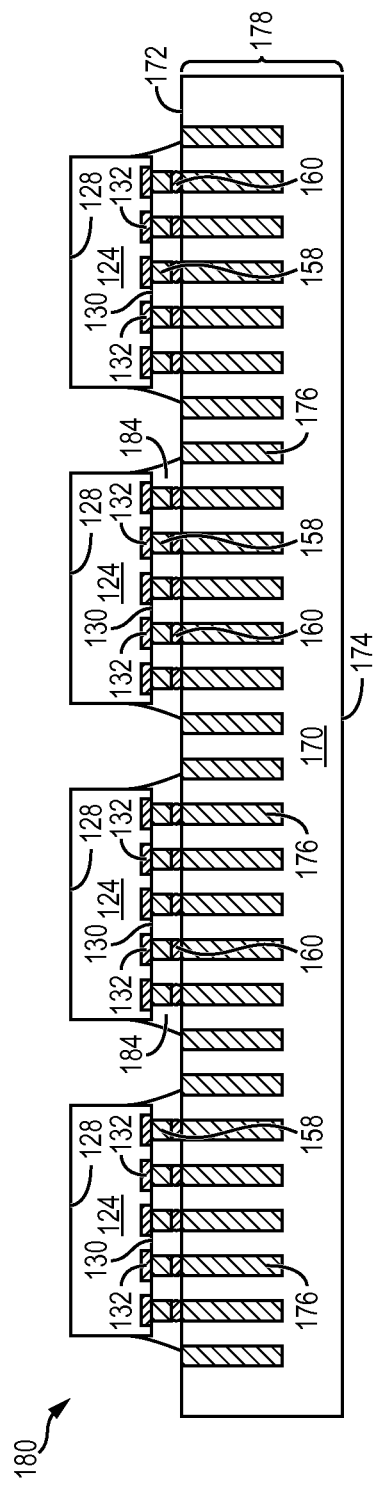

In FIG. 4e, an underfill material 184, such as epoxy resin, is deposited between semiconductor die 124 and TSV interposer 178 and around conductive pillars 158 and bumps 160. Underfill material 184 can be an encapsulant, molding compound, or polymer composite material, such as epoxy resin with filler, epoxy acrylate with filler, or polymer with proper filler. Underfill material 184 is cured. Underfill material 184 is non-conductive and environmentally protects the semiconductor device from external elements and contaminants.

Figure 4F:
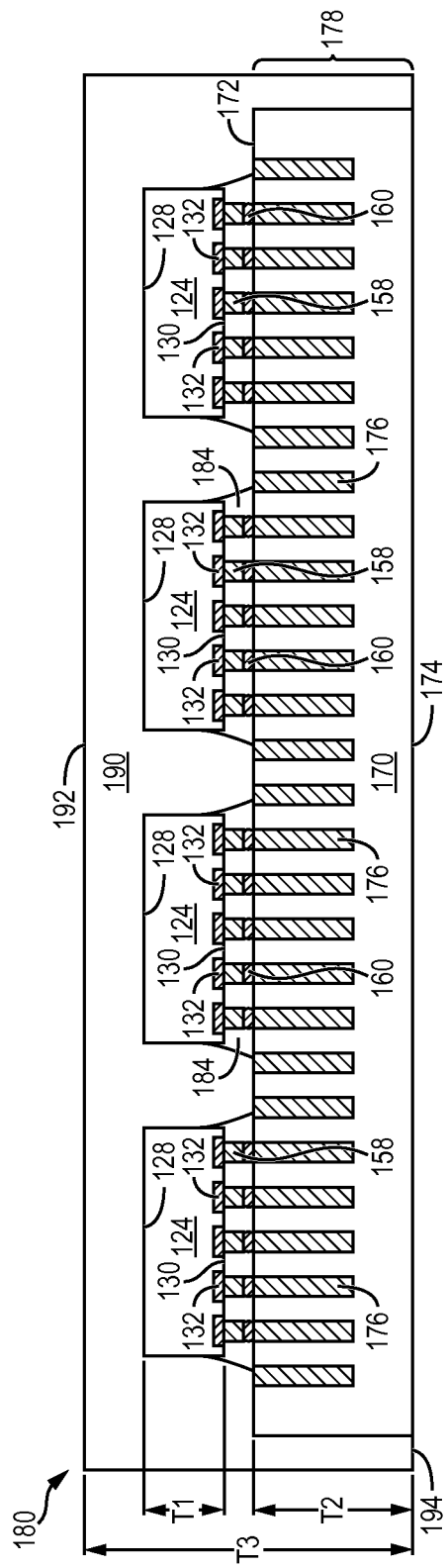

In FIG. 4f, an encapsulant or molding compound 190 is deposited over and around semiconductor die 124 and TSV interposer 178 using a paste printing, compressive molding, transfer molding, liquid encapsulant molding, vacuum lamination, film-assisted molding, or other suitable applicator. Encapsulant 190 can be polymer composite material, such as epoxy resin with filler, epoxy acrylate with filler, or polymer with proper filler. Encapsulant 190 is non-conductive, provides physical support, and environmentally protects the semiconductor device from external elements and contaminants. Encapsulant 190 is formed over back surface 128 of semiconductor die 124, and can be thinned at surface 192 in a subsequent backgrinding step. Encapsulant 190 is deposited around TSV interposer 178 such that surface 194 of encapsulant 190 opposite surface 192 is coplanar with surface 174 of TSV interposer 178.

A quantity or thickness of encapsulant 190 is selected based on the quantity and size of semiconductor die 124 and a thickness of TSV interposer 178. In one embodiment, the volume of encapsulant 190 is selected according to the total volume or amount of base substrate material 122 of semiconductor die 124 and base substrate material 170 of TSV interposer 178. The ratio of the total volume of base substrate materials 122 and 170, or base semiconductor material or silicon, to the volume of encapsulant 190, or mold, is referred to herein as the silicon to mold ratio or silicon to encapsulant ratio. The silicon to mold ratio is selected to reduce or minimize warpage of reconstituted wafer 180. In one embodiment, the silicon to mold ratio is calculated based on the quantity of semiconductor die 124 over TSV interposer 178. The amount of encapsulant 190 deposited over and around semiconductor die 124 is determined by the quantity and size of semiconductor die 124 and matches the predetermined silicon to mold ratio.

Semiconductor die 124 have a thickness T1, and in one embodiment, thickness T1 is approximately 350 micrometers (μm). TSV interposer 178 has a thickness T2, and in one embodiment, thickness T2 is approximately 770 μm. Encapsulant 190 has a thickness T3 measured from surface 192 to surface 194 of encapsulant 190. Thickness T3 is selected based on thicknesses T1 and T2 to optimize the silicon to mold ratio in order to provide sufficient thickness for structural support during processing while also minimizing warpage. In one embodiment, thickness T3 is approximately 1.31 mm, and provides a silicon to mold ratio of 2.57 and warpage or bend of −1.324 mm. The silicon to mold ratio of 2.57 minimizes warpage or bending of reconstituted wafer 180. Thickness T3 of encapsulant 190 provides structural support and stiffness for reconstituted wafer 180 during subsequent handling and RDL and bump formation.

Figure 4G:
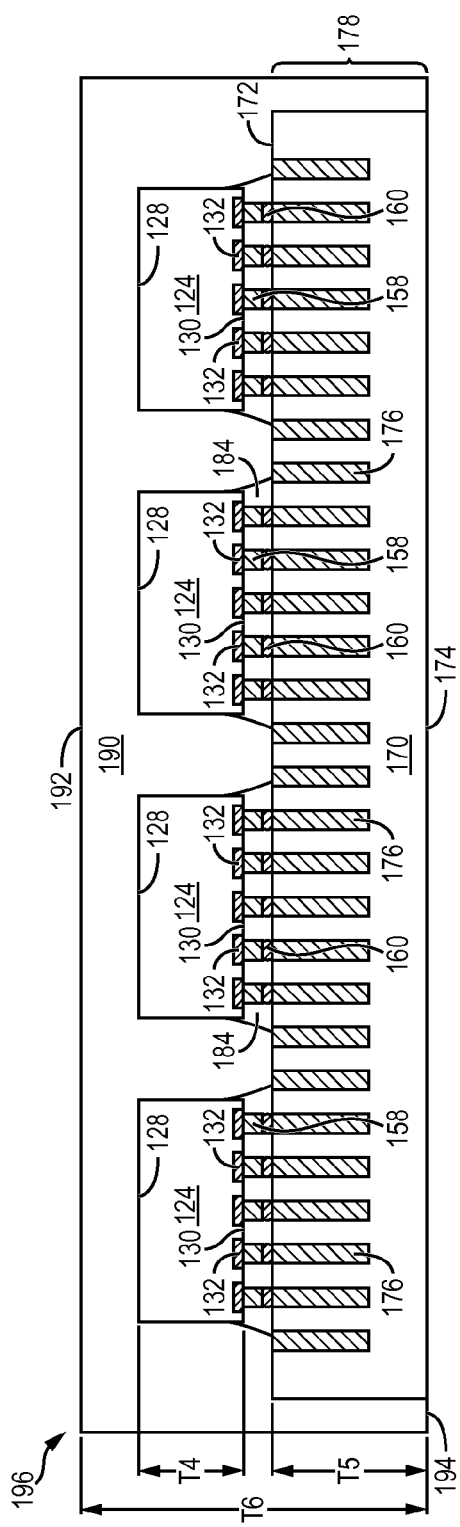

FIG. 4g shows an alternative reconstituted wafer 196 including a different thickness of semiconductor die and encapsulant and a different silicon to mold ratio to control warpage. The volume or amount of encapsulant 190 is selected according to the total volume or amount of base substrate materials 122 and 170 in reconstituted wafer 196 such that the silicon to mold ratio results in reduced warpage of reconstituted wafer 196. Semiconductor die 124 have a thickness T4, and in one embodiment, thickness T4 is approximately 450 μm. TSV interposer 178 has a thickness T5, and in one embodiment, thickness T5 is approximately 770 μm. Encapsulant 190 has a thickness T6 measured from surface 192 to surface 194 of encapsulant 190. Thickness T6 is selected based on thicknesses T4 and T5 to optimize the silicon to mold ratio in order to provide sufficient thickness for structural support during processing while also minimizing warpage. In one embodiment, thickness T6 is approximately 1.36 mm, and provides a silicon to mold ratio of 2.71 and warpage or bend of −1.17 mm. The silicon to mold ratio of reconstituted wafer 196 is greater than the silicon to mold ratio of reconstituted wafer 180, yet still provides structural support and stiffness for reconstituted wafer 196 during subsequent handling and RDL and bump formation. The silicon to mold ratio of 2.71 minimizes warpage or bending of reconstituted wafer 196.

Figure 4H:
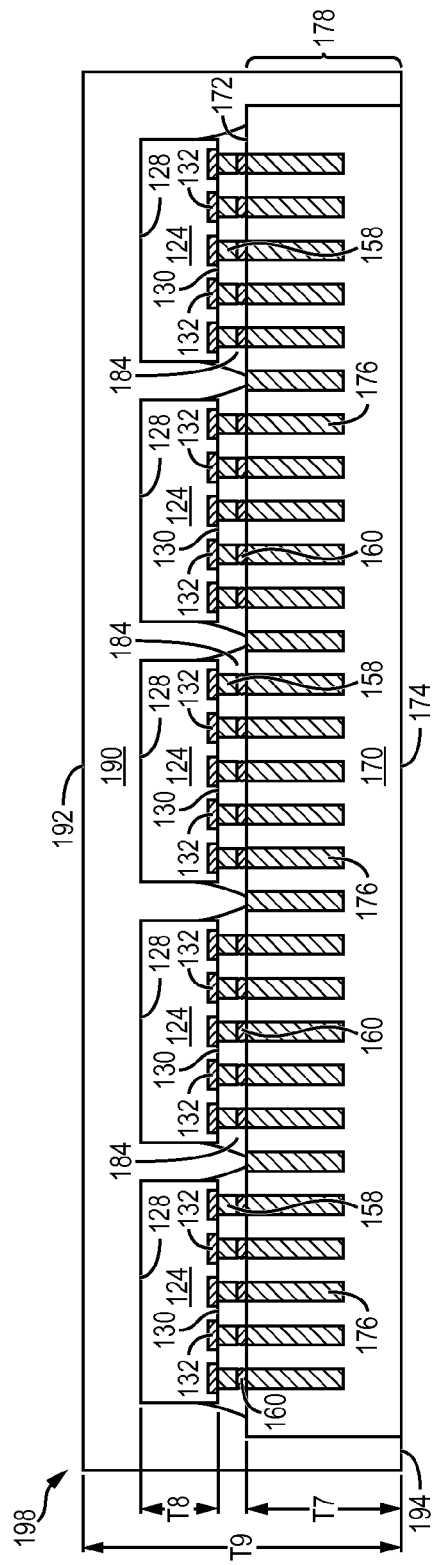

FIG. 4h shows an alternative reconstituted wafer 198 including a greater quantity of semiconductor die and a different silicon to mold ratio to control warpage. The volume of encapsulant 190 is selected according to the total volume of base substrate materials 122 and 170 in reconstituted wafer 198 such that the silicon to mold ratio results in reduced warpage of reconstituted wafer 198. In one embodiment, reconstituted wafer 198 has a diameter of approximately 300 mm and includes a quantity of 272 semiconductor die 124 disposed over TSV interposer 178. TSV interposer 178 has a thickness T7, and in one embodiment, thickness T7 is approximately 770 μm. Semiconductor die 124 have a thickness T8, and in one embodiment, thickness T8 is approximately 550 μm. Encapsulant 190 has a thickness T9 measured from surface 192 to surface 194 of encapsulant 190. Thickness T9 is selected based on thicknesses T7 and T8 to optimize the silicon to mold ratio in order to provide sufficient thickness for structural support during processing of reconstituted wafer 198 while minimizing warpage. In one embodiment, thickness T9 is approximately 1.44 mm, and provides a silicon to mold ratio of 3.19 and an average warpage or bend of −1.20 mm. The silicon to mold ratio of reconstituted wafer 198 is greater than the silicon to mold ratio of reconstituted wafer 180, yet still provides structural support and stiffness for reconstituted wafer 198 during subsequent handling and RDL and bump formation. The silicon to mold ratio of 3.19 minimizes warpage or bending of reconstituted wafer 198.

Figure 4I:
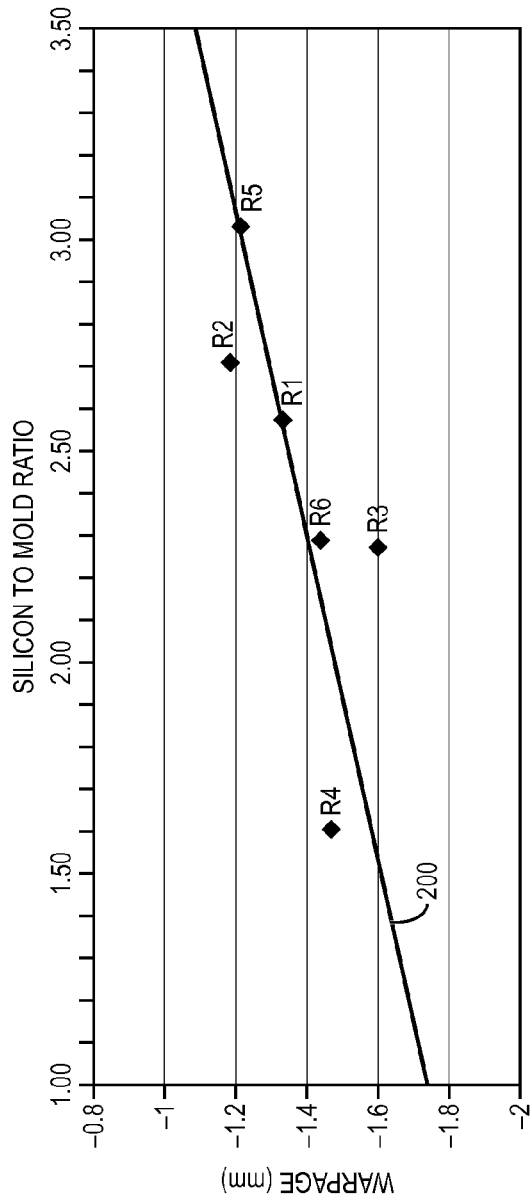

FIG. 4i shows a graphical view of the silicon to mold ratio in various reconstituted wafers and the warpage associated with the silicon to mold ratio. Reconstituted wafers, such as reconstituted wafers 180, 196, and 198, vary in diameter, quantity of semiconductor die 124, and size of semiconductor die 124. The volume of base substrate material 170 is determined by the diameter and thickness of TSV interposer 178. The volume of base substrate material 122 is determined by the quantity and size of semiconductor die 124 on the reconstituted wafer. The total volume of base substrate materials 122 and 170, which can be silicon, is calculated. The silicon to mold ratio is related to the degree of warpage by approximately a linear relationship, shown by line 200, which as a slope is defined by equation (1).

$$y = 0.2618x - 1.993 \quad (1)$$

where: y is the warpage in mm
x is the silicon to mold ratio

By determining the volume of base substrate material or silicon and the volume of encapsulant or molding compound, the silicon to mold ratio can be calculated and can be tuned or adjusted by changing the amount of encapsulant 190 deposited over semiconductor die 124 and TSV interposer 178. By determining the silicon to mold ratio, the warpage behavior of a reconstituted wafer can be predicted according to equation (1). The silicon to mold ratio is determined prior to depositing encapsulant 190, and the volume of encapsulant 190 is selected to match the predetermined silicon to mold ratio. Therefore, the volume of encapsulant 190 is selected to tune the silicon to mold ratio of each reconstituted wafer to maximize stiffness and structural support while minimizing warpage.

A silicon to mold ratio of 2.57 is shown in FIG. 4*i* at point R1 and results in −1.324 mm of warpage or bend. Reconstituted wafer 180 from FIG. 4*f* includes semiconductor die 124 with a thickness T1 and TSV interposer 178 with a thickness T2. In one embodiment, thickness T1 is approximately 350 µm and thickness T2 is approximately 770 µm. Thickness T3 of encapsulant 190 is selected to be approximately 1.31 mm for a silicon to mold ratio of 2.57. Based on the silicon to mold ratio of 2.57, reconstituted wafer 180 is expected to have approximately −1.324 mm of warpage or bend, as shown in FIG. 4*i* at point R1. The amount of encapsulant 190 deposited over and around semiconductor die 124 is determined based on the quantity and size of semiconductor die 124 and matches the predetermined silicon to mold ratio.

A silicon to mold ratio of 2.71 is shown in FIG. 4*i* at point R2 and results in −1.17 mm of warpage or bend. Reconstituted wafer 196 from FIG. 4*g* includes semiconductor die 124 with a thickness T4 and TSV interposer 178 with a thickness T5. In one embodiment, thickness T4 is approximately 450 µm and thickness T5 is approximately 770 µm. Thickness T6 of encapsulant 190 is selected to be approximately 1.36 mm for a silicon to mold ratio of 2.71. Based on the silicon to mold ratio of 2.71, reconstituted wafer 196 is expected to have approximately −1.17 mm of warpage or bend, as shown in FIG. 4*i* at point R2. The amount of encapsulant 190 deposited over and around semiconductor die 124 is determined based on the quantity and size of semiconductor die 124 and matches the predetermined silicon to mold ratio.

A silicon to mold ratio of 2.27 is shown at point R3 and results in −1.592 mm of warpage or bend. In another embodiment, reconstituted wafer 196 includes a thickness T4 of semiconductor die 124 of approximately 550 µm and thickness T5 of TSV interposer 178 of approximately 670 µm. Thickness T6 of encapsulant 190 is selected to be approximately 1.36 mm for a silicon to mold ratio of 2.27. Based on the silicon to mold ratio of 2.27, reconstituted wafer 196 is expected to have approximately −1.592 mm of warpage or bend, as shown in FIG. 4*i* at point R3. The amount of encapsulant 190 deposited over and around semiconductor die 124 is determined based on the quantity and size of semiconductor die 124 and matches the predetermined silicon to mold ratio.

A silicon to mold ratio of 1.60 is shown at point R4 and results in −1.461 mm of warpage or bend. In another embodiment, reconstituted wafer 196 includes a thickness T4 of semiconductor die 124 of approximately 770 µm and thickness T5 of TSV interposer 178 of approximately 450 µm. Thickness T6 of encapsulant 190 is selected to be approximately 1.36 mm for a silicon to mold ratio of 1.60. Based on the silicon to mold ratio of 1.60, reconstituted wafer 196 is expected to have approximately −1.461 mm of warpage or bend, as shown in FIG. 4*i* at point R4. The amount of encapsulant 190 deposited over and around semiconductor die 124 is determined based on the quantity and size of semiconductor die 124 and matches the predetermined silicon to mold ratio.

A silicon to mold ratio of 3.19 is shown in FIG. 4*i* at point R5 and results in approximately −1.20 mm of warpage or bend. Reconstituted wafer 198 from FIG. 4*h* includes TSV interposer 178 with a thickness T7 and semiconductor die 124 with a thickness T8. In one embodiment, TSV interposer 178 has a diameter of 297 mm and a quantity of 272 semiconductor die 124 disposed over TSV interposer 178. Semiconductor die 124 are 10.65 mm in width and 15.15 mm in length. Additional semiconductor die or components 124 may be disposed over TSV interposer 178. Semiconductor die 124 have a thickness T8 of 550 µm and TSV interposer 178 has a thickness T7 of 770 µm. Encapsulant 190 is selected to have a weight of 43.3 grams (g) and a thickness T9 of 1.44 mm for a silicon to mold ratio of 3.19. A height of encapsulant 190 over TSV interposer 178, or the difference between T9 and T7, is approximately 660 µm. Based on the silicon to mold ratio of 3.19, reconstituted wafer 198 is expected to have an average warpage or bend of −1.20 mm, as shown in FIG. 4*i* at point R5. The amount of encapsulant 190 deposited over and around semiconductor die 124 is determined based on the quantity and size of semiconductor die 124 and matches the predetermined silicon to mold ratio.

A silicon to mold ratio of 2.27 is shown in FIG. 4*i* at point R6 and results in −1.45 mm of warpage or bend. In another embodiment, reconstituted wafer 198 includes TSV interposer 178 having a diameter of 297 mm and a quantity of 218 semiconductor die 124 disposed over TSV interposer 178. Semiconductor die 124 are 10.65 mm in width and 15.15 mm in length. Additional semiconductor die or components 124 may be disposed over TSV interposer 178. Semiconductor die 124 have a thickness T8 of 550 µm and TSV interposer 178 has a thickness T7 of 670 µm. Encapsulant 190 is selected to have a weight of 52.9 g and a thickness T9 of 1.34 mm for a silicon to mold ratio of 2.27. A height of encapsulant 190 over TSV interposer 178, or the difference between T9 and T7, is approximately 660 µm. Based on the silicon to mold ratio of 2.27, reconstituted wafer 198 is expected to have approximately −1.45 mm of warpage or bend, as shown in FIG. 4*i* at point R6. The amount of encapsulant 190 deposited over and around semiconductor die 124 is determined based on the quantity and size of semiconductor die 124 and matches the predetermined silicon to mold ratio.

Figure 4J:
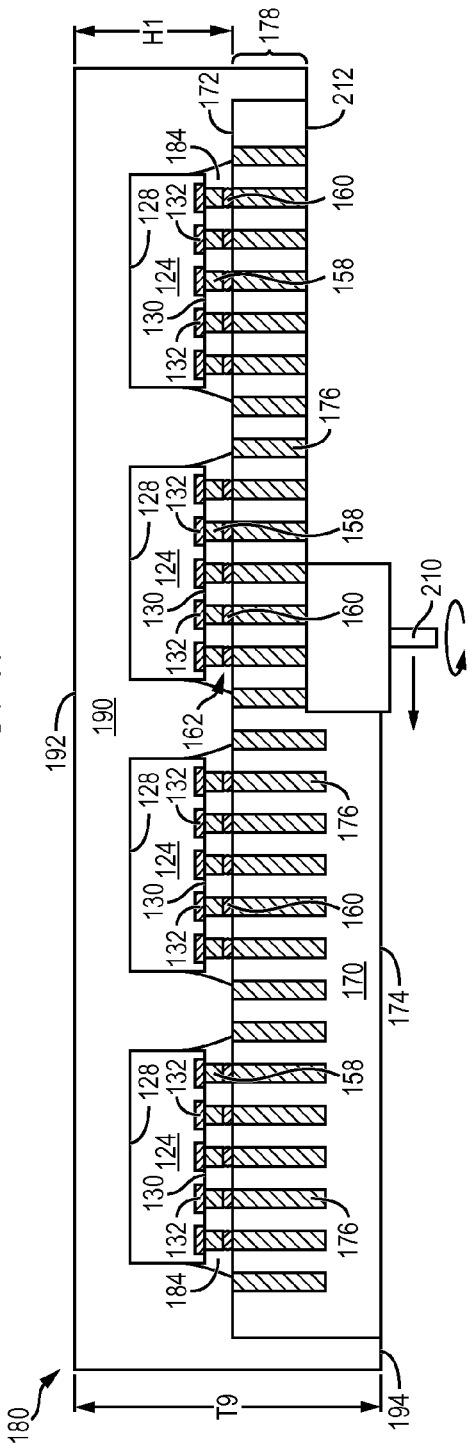

In FIG. 4*j*, a portion of base substrate material 170 of TSV interposer 178 is removed using backside via reveal (BVR) to expose conductive TSV 176. The BVR is accomplished by chemical mechanical polishing (CMP) of surface 174 using chemical slurries in combination with mechanical, physical-contact etching, by mechanical grinding with grinder 210, or by another suitable method. The BVR process leaves TSV 176 exposed at new surface 212 of TSV interposer 178. TSV interposer 178 is thinned during the BVR process. Although thinner substrates are more susceptible to warpage, encapsulant 190 deposited over TSV interposer 178 increases the stiffness of reconstituted wafer 180 to provide sufficient structural support during the BVR process such that a temporary carrier is not necessary. If encapsulant 190 is too thick, then mismatches in the coefficient of thermal expansion (CTE) arise between encapsulant 190 and base substrate materials 122 and 170. As described above, thickness T9 of encapsulant 190 selected to optimize the silicon to mold ratio in order to minimize warpage caused by CTE mismatch. Therefore, thickness T9 of encapsulant 190 provides structural support and minimizes warpage during the BVR process.

After the BVR process, TSV interposer 178 has a reduced thickness, and encapsulant 190 also has a reduced total thickness. Although the thickness T9 is reduced, the height H1 of encapsulant 190 over TSV interposer 178 remains the same. In one embodiment, height H1 of encapsulant 190 over TSV interposer 178 ranges from 540 µm to 910 µm. Encapsulant 190 with height H1 has a sufficient thickness to support reconstituted wafer 180 during subsequent processing steps, including formation of a build-up interconnect structure.

Figure 4K:
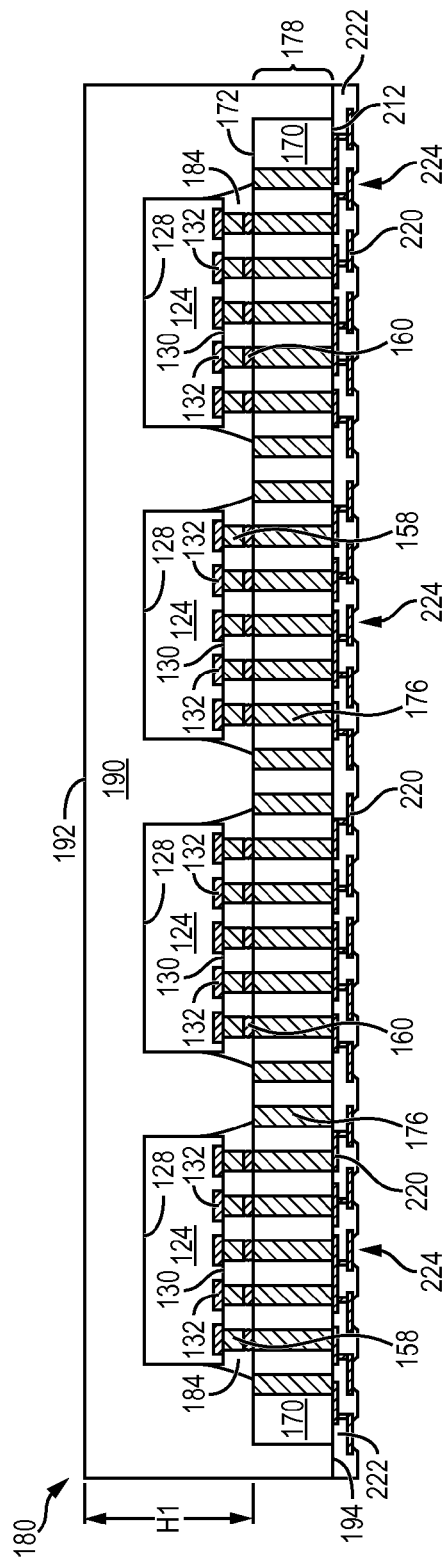

In FIG. 4*k*, an electrically conductive layer or redistribution layer (RDL) 220 is formed over surface 212 of TSV interposer 178 using a patterning and metal deposition process such as sputtering, electrolytic plating, and electroless plating. Conductive layer 220 can be one or more layers of Al, Cu, Sn, Ti, Ni, Au, Ag, W, or other suitable electrically conductive material. A portion of conductive layer 220 is electrically connected to conductive TSV 176. Other portions of conductive layer 220 can be electrically common or electrically isolated depending on the design and function of semiconductor die 124.

An insulating layer 222 is formed over surface 212 of TSV interposer 178 opposite semiconductor die 124. Insulating layer 222 is formed around and between conductive layers 220 using PVD, CVD, printing, lamination, spin coating, spray coating, sintering or thermal oxidation. Insulating layer 222 contains one or more layers of SiO2, Si3N4, SiON, Ta2O5, Al2O3, or other material having similar insulating and structural properties. A portion of insulating layer 222 is removed by an etching process or LDA to form openings 224 and to expose conductive layer 220.

Figure 4L:
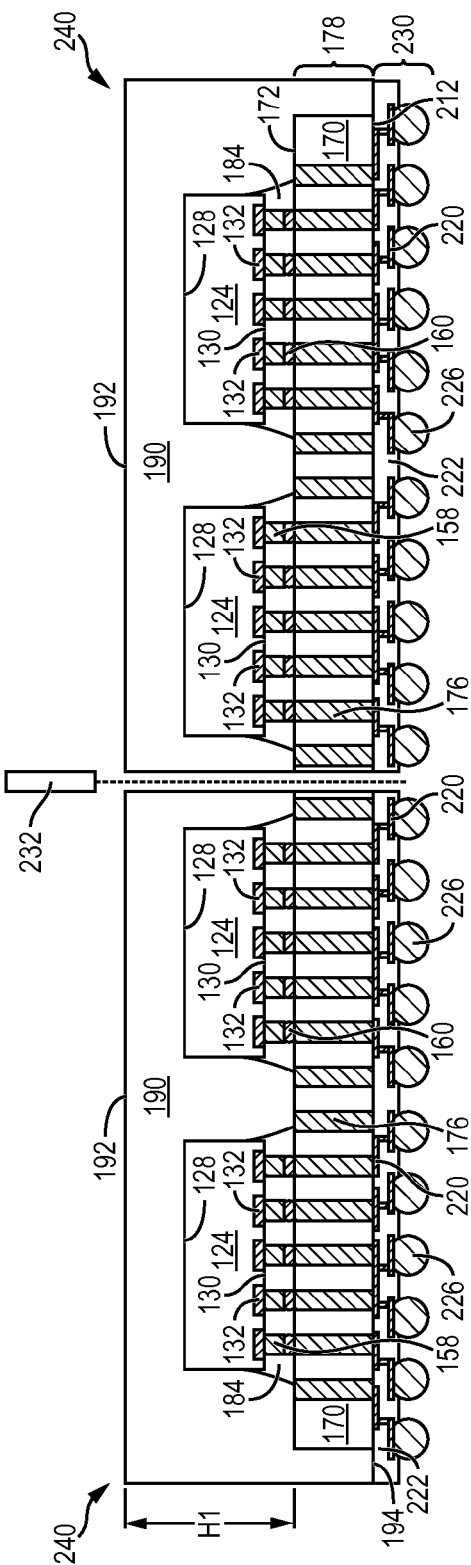

In FIG. 4l, an electrically conductive bump material is deposited over conductive layer 220 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 220 using a suitable attachment or bonding process. In one embodiment, the bump material is reflowed by heating the material above the material's melting point to form spherical balls or bumps 226. In some applications, bumps 226 are reflowed a second time to improve electrical contact to conductive layer 220. Bumps 226 can also be compression bonded to conductive layer 220. Bumps 226 represent one type of interconnect structure that can be formed over conductive layer 220. The interconnect structure can also use stud bump, micro bump, or other electrical interconnect.

Collectively, insulating layers 222, conductive layer 220, and bumps 226 constitute a build-up interconnect structure 230 formed over surface 212 of TSV interposer 178. Encapsulant 190 increases the stiffness of reconstituted wafer 180 to provide sufficient structural support during the formation of build-up interconnect structure 230 such that a temporary carrier is not necessary. Build-up interconnect structure 230 may include as few as one RDL or conductive layer, such as conductive layer 220, and one insulating layer, such as insulating layer 222. Additional insulating layers and RDLs can be formed over insulating layer 222 prior to forming bumps 226, to provide additional vertical and horizontal electrical connectivity across the package according to the design and functionality of semiconductor die 124.

Reconstituted wafer 180 is singulated with saw blade or laser cutting tool 232 into individual semiconductor packages 240. Reconstituted wafer 180 is singulated through encapsulant 190 and base substrate material 170 of TSV interposer 178 and through build-up interconnect structure 230.

Figure 5:
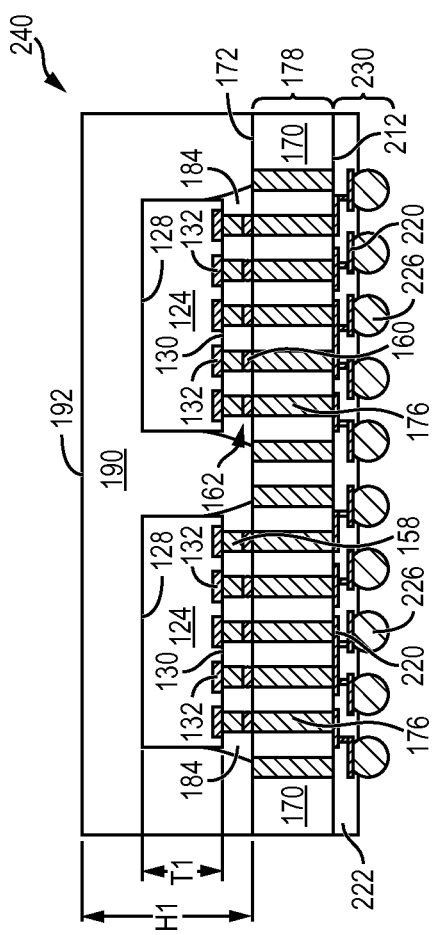
FIG. 5 illustrates a semiconductor device having reduced warpage.

FIG. 5 shows a semiconductor package 240 after singulation. Semiconductor die 124 is disposed over TSV interposer 178 with conductive pillars 158, and bumps 160 oriented toward TSV interposer 178. In one embodiment, two or more semiconductor die 124 are disposed side-by-side over TSV interposer 178 to form a 2.5D semiconductor package. 2.5D packaging technologies provide greater device integration and smaller profile packages with electrical interconnection between adjacent semiconductor die 124 facilitated by TSV interposer 178. Additional semiconductor die or components 124 may be mounted adjacent to semiconductor die 124 and over TSV interposer 178. Semiconductor die 124 within semiconductor package 240 may be similar or different in size or shape than adjacent semiconductor die 124. Conductive pillars 158 and bumps 160 are electrically connected to conductive TSV 176. TSV interposer 178 routes electrical signals between semiconductor die 124 and build-up interconnect structure 230. Build-up interconnect structure 230 provides vertical electrical interconnection to external devices, for example a PCB.

Encapsulant 190 is disposed over and around semiconductor die 124 and TSV interposer 178. Encapsulant 190 provides structural support during the manufacturing of semiconductor packages 240. In particular, encapsulant 190 supports reconstituted wafer 180 during the BVR process and during formation of build-up interconnect structure 230. Therefore, semiconductor packages 240 can be handled and processed without a temporary carrier. Semiconductor packages 240 are produced more cost-effectively without the expensive process of temporary bonding to a carrier and subsequently debonding from the carrier. Elimination of the temporary carrier bonding and debonding steps substantially reduces the cost of manufacturing semiconductor packages 240.

Additionally, the silicon to mold ratio within reconstituted wafer 180 improves the thermal performance and electrical reliability of semiconductor packages 240. The amount of encapsulant 190 deposited over semiconductor die 124 and TSV interposer 178 is selected depending on the volume of base substrate material 122 of semiconductor die 124 and base substrate material 170 of TSV interposer 178 in order to minimize warpage while providing structural support. The silicon to mold ratio of reconstituted wafer 180 reduces warpage of reconstituted wafer 180 and improves the reliability of electrical connections within semiconductor package 240. The silicon to mold ratio also ensures a sufficient stiffness and support for TSV interposer 178 before and after the BVR process. Accordingly, semiconductor package 240 provides a cost efficient device with improved thermal performance and reliability.

Figure 6A:
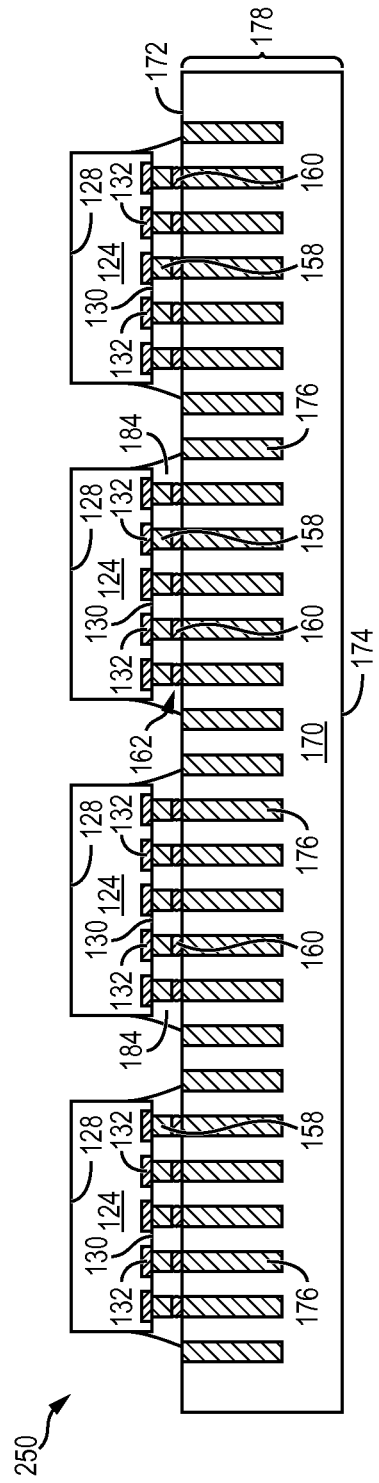

FIGS. 6a-6k illustrate, in relation to FIGS. 1 and 2a-2c, an alternative process of forming a semiconductor device with reduced warpage. FIG. 6a shows reconstituted wafer 250 similar to reconstituted wafer 180 from FIG. 4e. In FIG. 6a, semiconductor die 124 from FIGS. 3a-3g are mounted to TSV interposer 178 using a pick and place operation with active surface 130, conductive pillars 158, and bumps 160 oriented toward TSV interposer 178. Conductive pillars 158 and bumps 160 are electrically connected to conductive TSV 176. Additional electrically conductive layers and insulating layers may be formed over TSV interposer 178 prior to mounting semiconductor die 124. Semiconductor die 124 are mounted to TSV interposer 178 to form a reconfigured or reconstituted wafer 250. Underfill material 184 is deposited between semiconductor die 124 and TSV interposer 178 and around conductive pillars 158 and bumps 160.

Figures 6B, 6C:
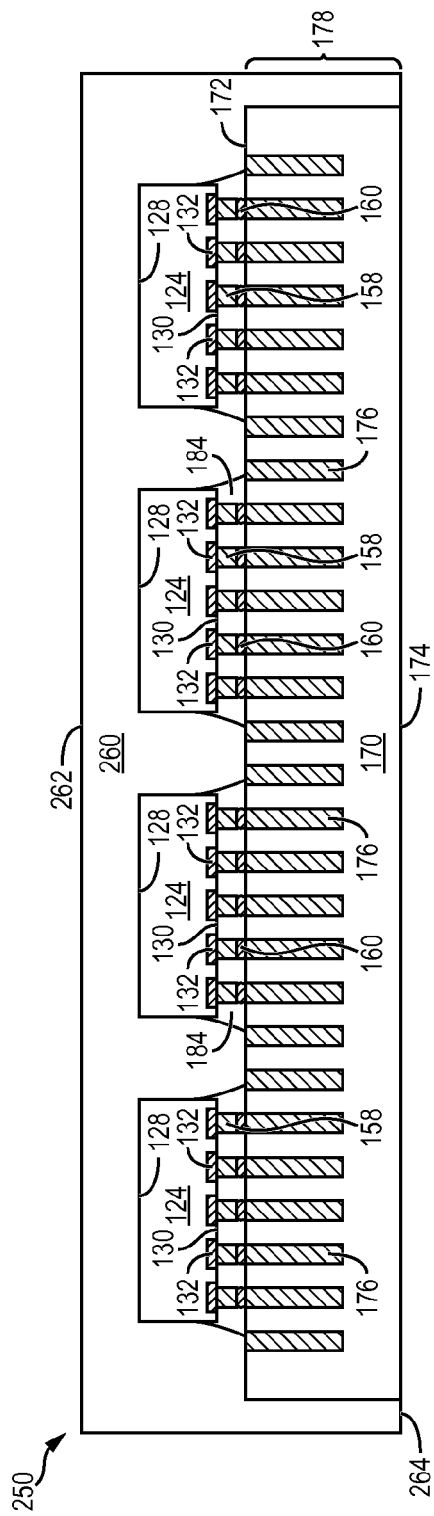

In FIG. 6b, an encapsulant or molding compound 260 is deposited over and around semiconductor die 124 and TSV interposer 178 using a paste printing, compressive molding, transfer molding, liquid encapsulant molding, vacuum lamination, film-assisted molding, or other suitable applicator. Encapsulant 260 can be polymer composite material, such as epoxy resin with filler, epoxy acrylate with filler, or polymer with proper filler. Encapsulant 260 is non-conductive, provides physical support, and environmentally protects the semiconductor device from external elements and contaminants. Encapsulant 260 is formed over back surface 128 of semiconductor die 124, and can be thinned in a subsequent backgrinding step. Alternatively, encapsulant 260 is deposited such that surface 262 of encapsulant 260 is coplanar with back surface 128 of semiconductor die 124, and does not cover back surface 128. Encapsulant 260 is deposited around TSV interposer 178 such that surface 264 of encapsulant 260 opposite surface 262 is coplanar with surface 174 of TSV interposer 178.

In FIG. 6c, a backside surface 262 of encapsulant 260 undergoes a grinding operation with grinder 270 to planarize and reduce a thickness of encapsulant 260. A chemical etch can also be used to remove and planarize encapsulant 260. After the grinding operation, new surface 272 of encapsulant 260 is coplanar with back surface 128 of semiconductor die 124. Removing a portion of encapsulant 260 from surface 262 also decreases the volume of encapsulant 260 in reconstituted wafer 250. Decreasing the volume of encapsulant 260 in reconstituted wafer 250 increases the silicon to mold ratio and improves the warpage behavior of reconstituted wafer 250 during subsequent processing steps.

Figure 6D:
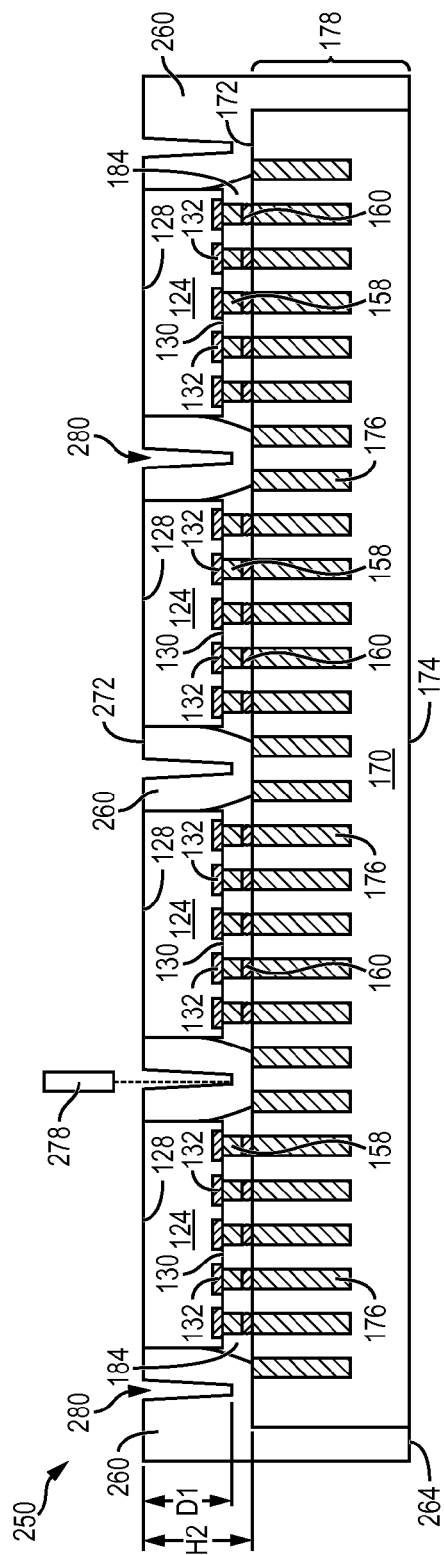

In FIG. 6d, a portion of encapsulant 260 is removed from surface 272 by saw blade or laser cutting tool 278 to form channels or recesses 280 in encapsulant 260. Channels 280 are formed partially but not completely through encapsulant 260 outside a footprint of semiconductor die 124 and over TSV interposer 178. Channels 280 are cut in two perpendicular X and Y directions into surface 272 of encapsulant 260. Channels 280 are formed in a peripheral region of semiconductor die 124. Encapsulant 260 includes a height H2 over TSV interposer 178 measured from surface 172 of TSV interposer 178 to surface 272 of encapsulant 260. Channels 280 are formed having a depth D1 measured from surface 272 of encapsulant 260 to a bottom surface of channels 280. Depth D1 of channels 280 is selected to provide stress relief and reduce warpage for reconstituted wafer 250 during subsequent RDL and bump formation. In one embodiment, where encapsulant 260 has a height H2 of 530 μm over TSV interposer 178, channels 280 are formed having a depth D1 of 500 μm and provide a 40% decrease in warpage of reconstituted wafer 250.

Removing a portion of encapsulant 260 by forming channels 280 also decreases the volume of encapsulant 260 in reconstituted wafer 250. Decreasing the volume of encapsulant 260 in reconstituted wafer 250 increases the silicon to mold ratio and improves the warpage behavior of reconstituted wafer 250 during subsequent processing steps. In one embodiment, the volume or amount of encapsulant 260 is selected according to the total volume or amount of base substrate material 122 of semiconductor die 124 and base substrate material 170 of TSV interposer 178. In another embodiment, the silicon to mold ratio is calculated based on the quantity of semiconductor die 124 over TSV interposer 178. The amount of encapsulant 260 deposited over and around semiconductor die 124 is determined based on the quantity and size of semiconductor die 124 or the predetermined silicon to mold ratio.

Figure 6E:
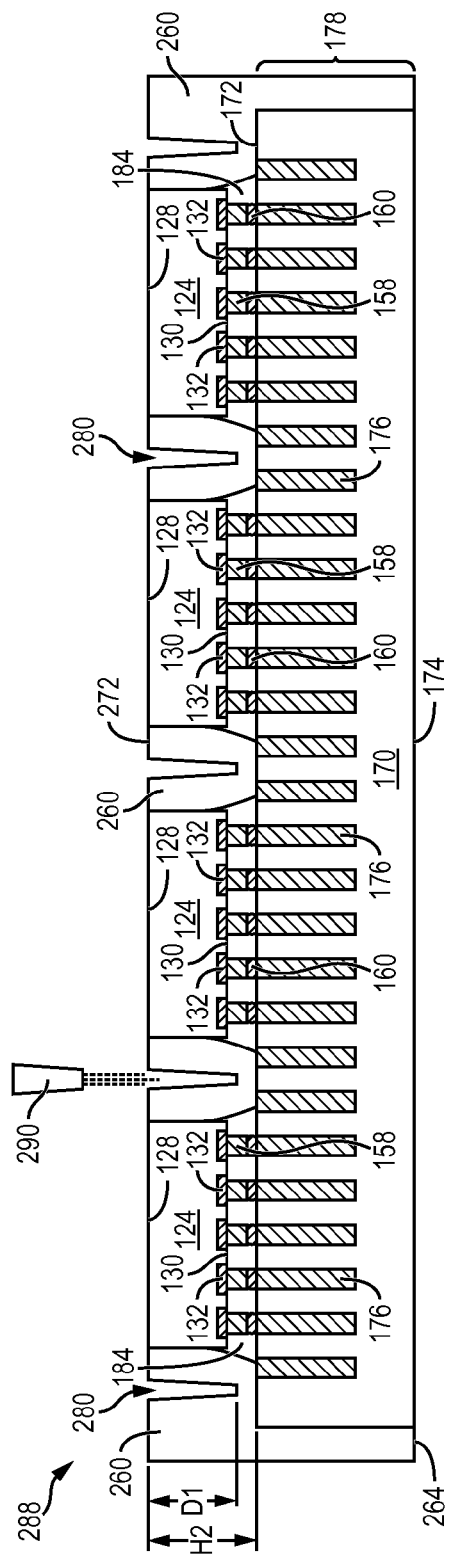

FIG. 6e shows an alternative process of forming channels 280 in encapsulant 260 of reconstituted wafer 288. Channels 280 are formed partially but not completely through encapsulant 260 outside a footprint of semiconductor die 124. Channels 280 are formed by sand blasting or wet etching. Channels 280 are formed having a depth D1 measured from surface 272 of encapsulant 260 to a bottom surface of channels 280. Depth D1 of channels 280 is selected to provide stress relief and reduce warpage for reconstituted wafer 288 during subsequent RDL and bump formation. In one embodiment, where encapsulant 260 has a height H2 of 530 μm over TSV interposer 178, channels 280 are formed having a depth D1 of 500 μm and provide a 40% decrease in warpage of reconstituted wafer 288.

Figure 6F:
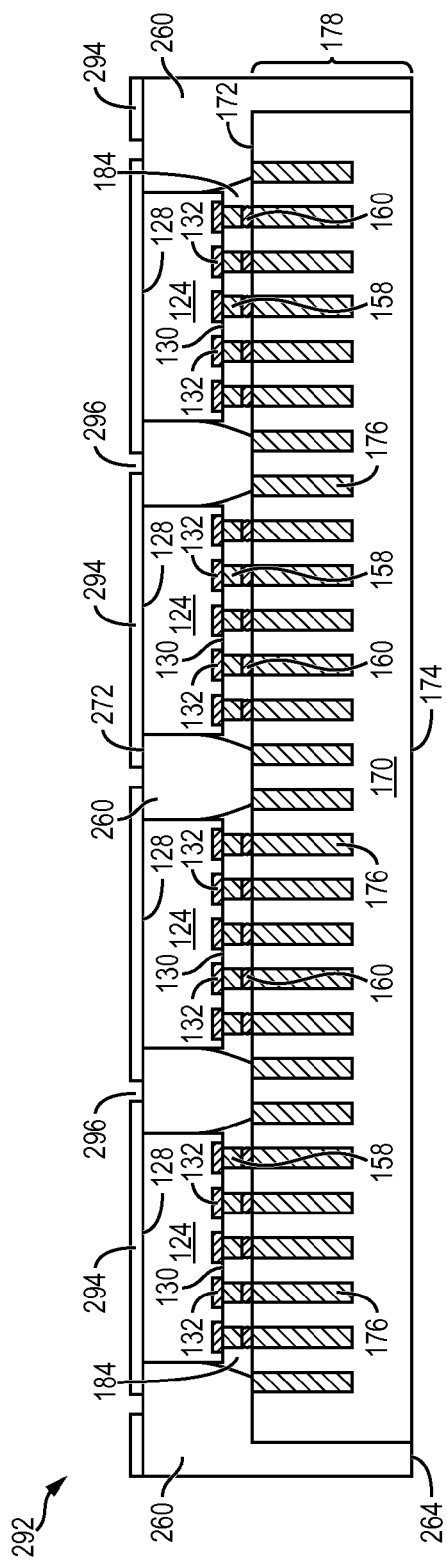
Figure 6G:
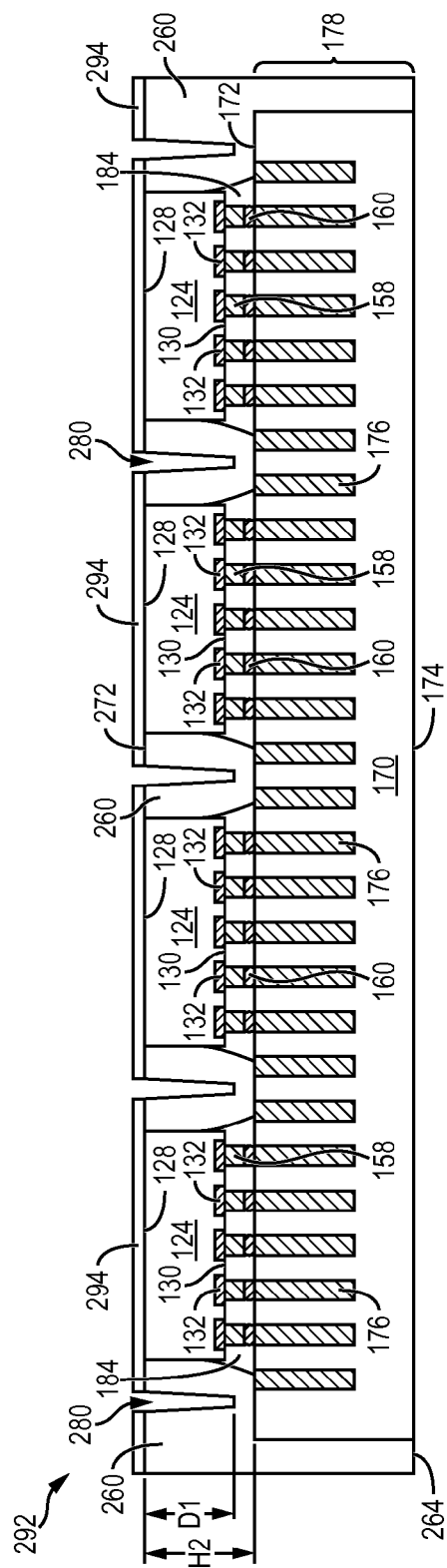

FIGS. 6f-6h show another process of forming channels 280 in encapsulant 260 of reconstituted wafer 292. In FIG. 6f, a patterning or photoresist layer 294 is formed over surface 272 of encapsulant 260 and over back surface 128 of semiconductor die 124 using printing, spin coating, or spray coating. In some embodiments that utilize an insulating layer for patterning, the insulating layer can include one or more layers of SiO2, Si3N4, SiON, Ta2O5, Al2O3, or other material having similar structural properties. A portion of photoresist layer 294 is removed by an etching or LDA process to form openings 296.

In FIG. 6g, encapsulant 260 is patterned by an exposure and development process, etching, or other suitable process to remove portions of encapsulant 260 to form channels 280 through openings 296.

In FIG. 6h, photoresist layer 294 is removed from surface 272 of encapsulant 260 and back surface 128 of semiconductor die 124. Channels 280 are formed having a depth D1 measured from surface 272 of encapsulant 260 to a bottom surface of channels 280. Depth D1 of channels 280 is selected to provide stress relief and reduce warpage for reconstituted wafer 292 during subsequent RDL and bump formation. In one embodiment, where encapsulant 260 has a height H2 of 530 μm over TSV interposer 178, channels 280 are formed having a depth D1 of 500 μm and provide a 40% decrease in warpage of reconstituted wafer 292.

In FIG. 6i, a portion of base substrate material 170 of TSV interposer 178 is removed using BVR to expose conductive TSV 176. The BVR is accomplished by CMP of surface 174 using chemical slurries in combination with mechanical, physical-contact etching, by mechanical grinding with grinder 300, or by another suitable method. The BVR process leaves TSV 176 exposed at new surface 302 of TSV interposer 178. TSV interposer 178 is thinned during the BVR process. Although thinner substrates are more susceptible to warpage, encapsulant 260 deposited over TSV interposer 178 increases the stiffness of reconstituted wafer 250 to provide sufficient structural support during the BVR process such that a temporary carrier is not necessary. If encapsulant 260 is too thick, then mismatches in the CTE arise between encapsulant 260 and base substrate materials 122 and 170. Height H2 of encapsulant 260 selected to optimize the silicon to mold ratio in order to minimize warpage caused by CTE mismatch. Therefore, height H2 of encapsulant 260 provides structural support and minimizes warpage during the BVR process.

After the BVR process, TSV interposer 178 has a reduced thickness. Encapsulant 260 also has a reduced total thickness, measured from surface 272 to new surface 302. Although a total thickness of encapsulant 260 is reduced, the height H2 of encapsulant 260 over TSV interposer 178 remains the same. In one embodiment, height H2 of encapsulant 260 over TSV interposer 178 ranges from 530 μm to 910 μm. Encapsulant 260 with height H2 has a sufficient thickness to support reconstituted wafer 250 during subsequent processing steps, including formation of a build-up interconnect structure.

Figure 6J:
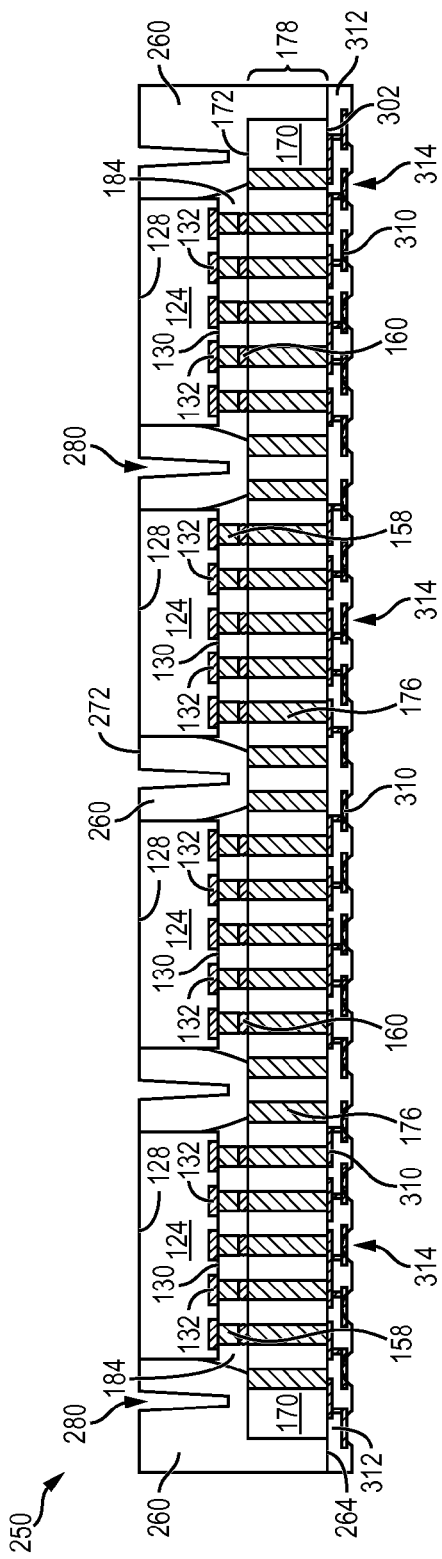

In FIG. 6j, an electrically conductive layer or RDL 310 is formed over surface 302 of TSV interposer 178 using a patterning and metal deposition process such as sputtering, electrolytic plating, and electroless plating. Conductive layer 310 can be one or more layers of Al, Cu, Sn, Ti, Ni, Au, Ag, W, or other suitable electrically conductive material. A portion of conductive layer 310 is electrically connected to conductive TSV 176. Other portions of conductive layer 310 can be electrically common or electrically isolated depending on the design and function of semiconductor die 124.

An insulating layer 312 is formed over surface 302 of TSV interposer 178 opposite semiconductor die 124. Insulating layer 312 is formed around and between conductive layers 310 using PVD, CVD, printing, lamination, spin coating, spray coating, sintering or thermal oxidation. Insulating layer 312 contains one or more layers of SiO2, Si3N4, SiON, Ta2O5, Al2O3, or other material having similar insulating and structural properties. A portion of insulating layer 312 is removed by an etching process or LDA to form openings 314 and to expose conductive layer 310.

Figure 6K:
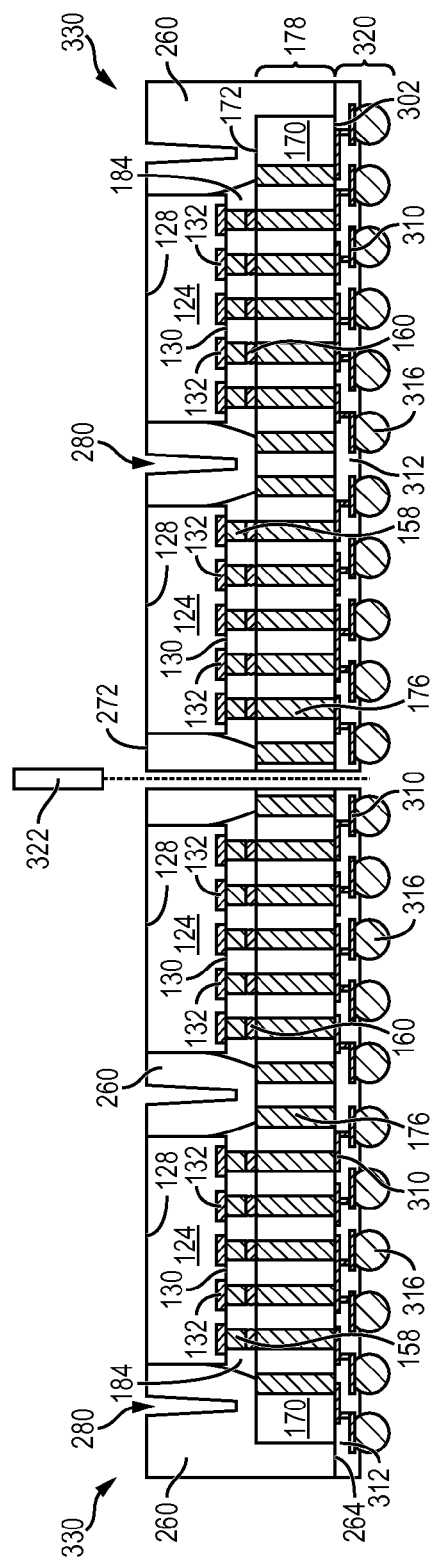

In FIG. 6k, an electrically conductive bump material is deposited over conductive layer 310 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 310 using a suitable attachment or bonding process. In one embodiment, the bump material is reflowed by heating the material above the material's melting point to form spherical balls or bumps 316. In some applications, bumps 316 are reflowed a second time to improve electrical contact to conductive layer 310. Bumps 316 can also be compression bonded to conductive layer 310. Bumps 316 represent one type of interconnect structure that can be formed over conductive layer 310. The interconnect structure can also use stud bump, micro bump, or other electrical interconnect.

Collectively, insulating layers 312, conductive layer 310, and bumps 316 constitute a build-up interconnect structure 320 formed over surface 302 of TSV interposer 178. Build-up interconnect structure 320 may include as few as one RDL or conductive layer, such as conductive layer 310, and one insulating layer, such as insulating layer 312. Additional insulating layers and RDLs can be formed over insulating layer 312 prior to forming bumps 316, to provide additional vertical and horizontal electrical connectivity across the package according to the design and functionality of semiconductor die 124.

Semiconductor die 124 are singulated with saw blade or laser cutting tool 322 into individual semiconductor packages 330. Reconstituted wafer 250 is singulated through encapsulant 260 and base substrate material 170 of TSV interposer 178. Reconstituted wafer 250 is also singulated through channels 280. The dimensions of channels 280 are selected such that channels 280 are removed during singulation and channels 280 are not present in semiconductor packages 330. Saw blade or laser cutting tool 322 cuts through channels 280, in order to reduce the chipping of base substrate material during singulation.

Figure 7:
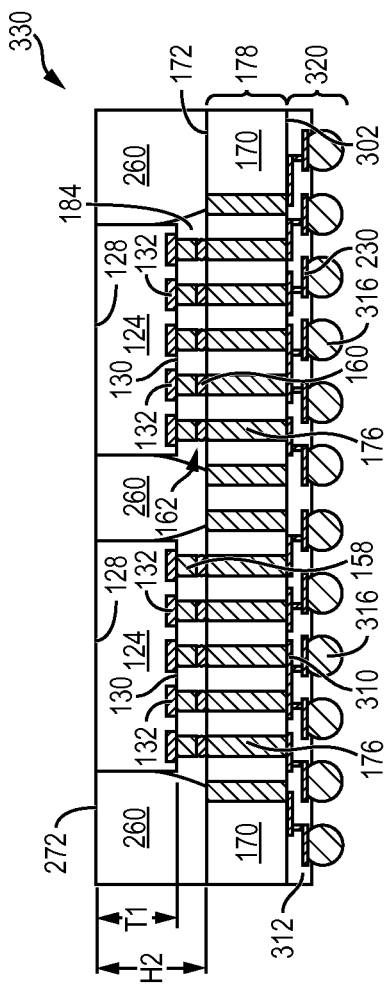
FIG. 7 illustrates a semiconductor device having reduced warpage.

FIG. 7 shows a semiconductor package 330 after singulation. Semiconductor die 124 is disposed over TSV interposer 178 with conductive pillars 158, and bumps 160 oriented toward TSV interposer 178. In one embodiment, two or more semiconductor die 124 are disposed side-by-side over TSV interposer 178 to form a 2.5D semiconductor package. 2.5D packaging technologies provide greater device integration and smaller profile packages with electrical interconnection between adjacent semiconductor die 124 facilitated by TSV interposer 178. Additional semiconductor die or components 124 may be mounted adjacent to semiconductor die 124 and over TSV interposer 178. Semiconductor die 124 within semiconductor package 330 may be similar or different in size or shape than adjacent semiconductor die 124. Conductive pillars 158 and bumps 160 are electrically connected to conductive TSV 176. TSV interposer 178 routes electrical signals between semiconductor die 124 and build-up interconnect structure 320. Build-up interconnect structure 320 provides vertical electrical interconnection to external devices, for example a PCB.

Encapsulant 260 is disposed over and around semiconductor die 124 and TSV interposer 178. Encapsulant 260 provides structural support during the manufacturing of semiconductor packages 330. In particular, encapsulant 260 supports reconstituted wafer 250 during the BVR process and during formation of build-up interconnect structure 320. Therefore, semiconductor packages 330 can be handled and processed without a temporary carrier. Semiconductor packages 330 are produced more cost-effectively without the expensive process of temporary bonding to a carrier and subsequently debonding from the carrier. Elimination of the temporary carrier bonding and debonding steps substantially reduces the cost of manufacturing semiconductor packages 330.

Additionally, the silicon to mold ratio within reconstituted wafer 250 improves the thermal performance and electrical reliability of semiconductor packages 330. The amount of encapsulant 260 removed from reconstituted wafer 250 is selected in order to minimize warpage while providing structural support. Channels 280 formed in encapsulant 260 further reduce the volume of encapsulant 260 within reconstituted wafer 250 and increases the silicon to mold ratio. The silicon to mold ratio of reconstituted wafer 250 reduces warpage of reconstituted wafer 250 and improves the reliability of electrical connections within semiconductor package 330. The silicon to mold ratio also ensures a sufficient stiffness and support for TSV interposer 178 before and after the BVR process. Accordingly, semiconductor package 330 provides a cost efficient device with improved thermal performance and reliability.

Figure 8A:
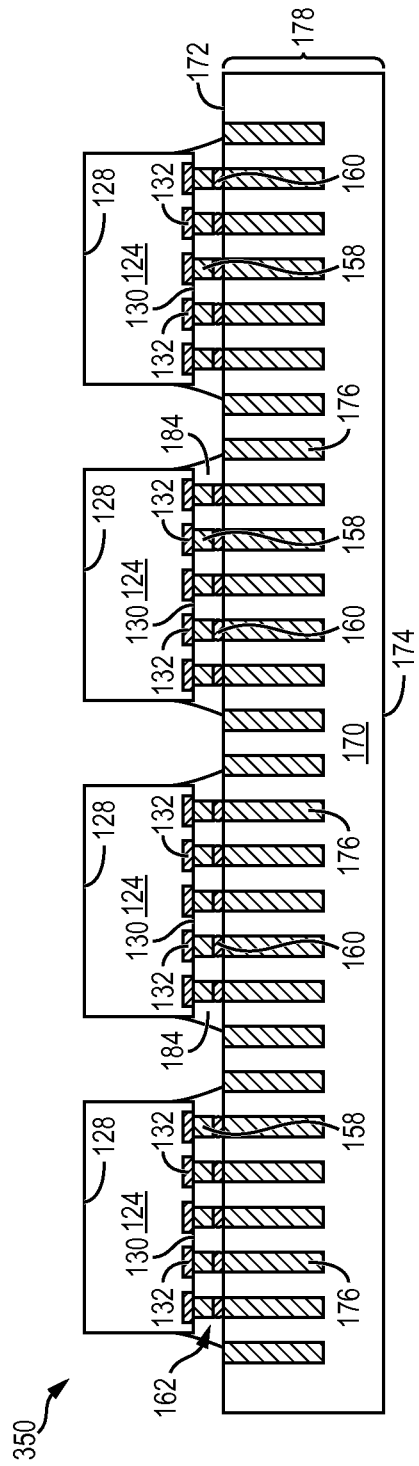
FIGS. 8a-8e illustrate another process of forming a semiconductor device with reduced warpage.

FIGS. 8a-8e show, in relation to FIGS. 1 and 2a-2c, another process of forming a semiconductor device with reduced warpage. FIG. 8a shows reconstituted wafer 350 similar to reconstituted wafer 180 from FIG. 4e and similar to reconstituted wafer 250 from FIG. 6a. In FIG. 8a, semiconductor die 124 from FIGS. 3a-3g are mounted to TSV interposer 178 using a pick and place operation with active surface 130, conductive pillars 158, and bumps 160 oriented toward TSV interposer 178. Conductive pillars 158 and bumps 160 are electrically connected to conductive TSV 176. Additional electrically conductive layers and insulating layers may be formed over TSV interposer 178 prior to mounting semiconductor die 124. Semiconductor die 124 are mounted to TSV interposer 178 to form a reconfigured or reconstituted wafer 350. Underfill material 184 is deposited between semiconductor die 124 and TSV interposer 178 and around conductive pillars 158 and bumps 160.

Figure 8B:
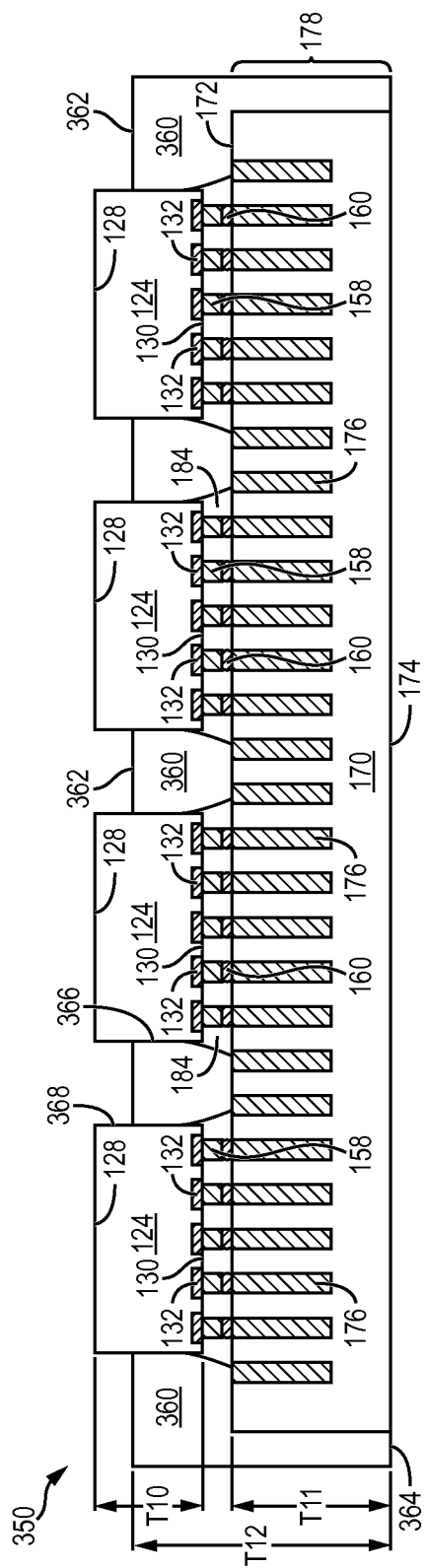

In FIG. 8b, an encapsulant or molding compound 360 is deposited over and around semiconductor die 124 and TSV interposer 178 using a paste printing, compressive molding, transfer molding, liquid encapsulant molding, vacuum lamination, film-assisted molding, or other suitable applicator. Encapsulant 360 can be polymer composite material, such as epoxy resin with filler, epoxy acrylate with filler, or polymer with proper filler. Encapsulant 360 is non-conductive, provides physical support, and environmentally protects the semiconductor device from external elements and contaminants. Encapsulant 360 surrounds TSV interposer 178, underfill 184, and a portion of semiconductor die 124. Back surface 128 of semiconductor die 124 remains uncovered or exposed with respect to encapsulant 360. Encapsulant 360 is deposited around TSV interposer 178 such that surface 364 of encapsulant 360 opposite surface 362 is coplanar with surface 174 of TSV interposer 178. In one embodiment, encapsulant 360 is photosensitive and is patterned by an exposure and development process, etching or other suitable process to expose a portion of semiconductor die 124. Encapsulant 360 is deposited over semiconductor die 124 and back surface 128, and subsequently, encapsulant 360 is partially removed by the exposure and development process. In another embodiment, encapsulant 360 is deposited by printing and leaves semiconductor die 124 partially exposed with respect to encapsulant 360.

Encapsulant 360 covers a portion of side surface 366 of semiconductor die 124 while leaving portion 368 of side surface 366 exposed. A thickness of encapsulant 360 over TSV interposer 178 is less than a height of semiconductor die 124 together with conductive pillars 158 and bumps 160. In one embodiment, the volume or amount of encapsulant 360 is selected according to the total volume or amount of base substrate material 122 of semiconductor die 124 and base substrate material 170 of TSV interposer 178. In another embodiment, the silicon to mold ratio is calculated based on the quantity of semiconductor die 124 over TSV interposer 178. The amount of encapsulant 360 deposited over and around semiconductor die 124 is determined based on the quantity and size of semiconductor die 124 or the predetermined silicon to mold ratio. The silicon to mold ratio is determined prior to depositing encapsulant 260, and the volume of encapsulant 260 is selected to match the predetermined silicon to mold ratio. Therefore, the volume of encapsulant 260 is selected to tune the silicon to mold ratio of each reconstituted wafer to maximize stiffness and structural support while minimizing warpage.

Semiconductor die 124 have a thickness T10, and in one embodiment, thickness T10 ranges from approximately 350 µm to 770 µm. TSV interposer 178 has a thickness T11, and in one embodiment, thickness T11 ranges from approximately 450 µm to 770 µm. Encapsulant 360 has a thickness T12 measured from surface 362 to surface 364 of encapsulant 360. Thickness T12 is selected based on thicknesses T10 and T11 to optimize the silicon to mold ratio in order to provide sufficient thickness for structural support during processing while also minimizing warpage. The silicon to mold ratio of reconstituted wafer 350 is selected to provide structural support and stiffness for reconstituted wafer 350 during subsequent handling and RDL and bump formation. In one embodiment, thickness T12 is less than 1.36 mm.

Figure 8C:
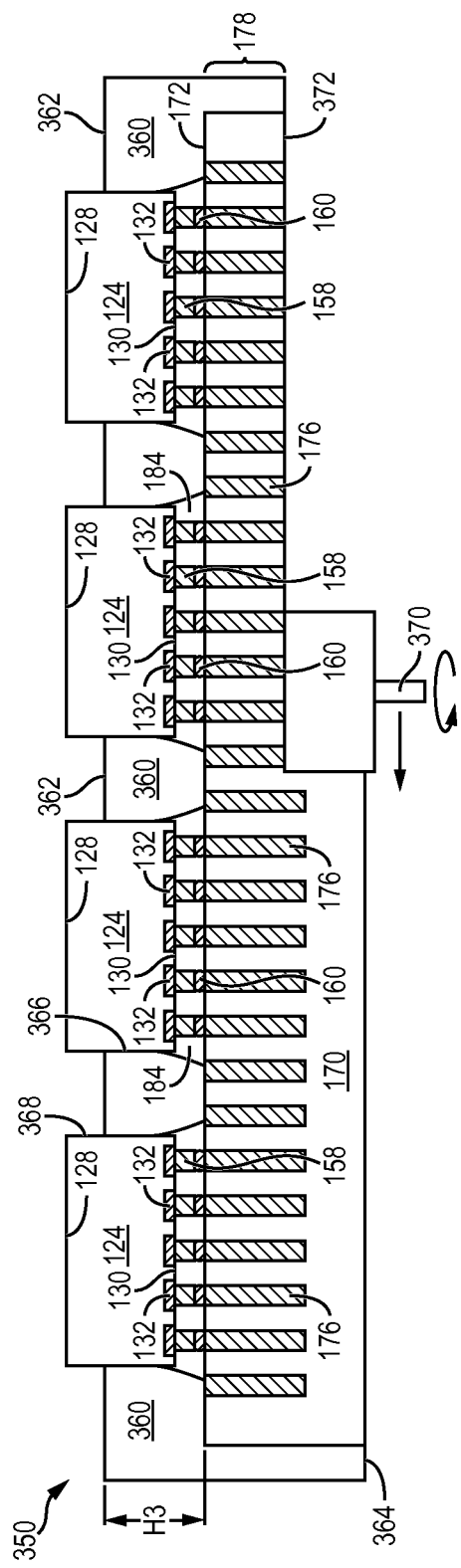

In FIG. 8c, a portion of base substrate material 170 of TSV interposer 178 is removed using BVR to expose conductive TSV 176. The BVR is accomplished by CMP of surface 174 using chemical slurries in combination with mechanical, physical-contact etching, by mechanical grinding with grinder 370, or by another suitable method. The BVR process leaves TSV 176 exposed at new surface 372 of TSV interposer 178. TSV interposer 178 is thinned during the BVR process. Although thinner substrates are more susceptible to warpage, encapsulant 360 deposited over TSV interposer 178 increases the stiffness of reconstituted wafer 350 to provide sufficient structural support during the BVR process such that a temporary carrier is not necessary. If encapsulant 360 is too thick, then mismatches in the CTE arise between encapsulant 360 and base substrate materials 122 and 170. Encapsulant 360 includes a height H3 over TSV interposer 178 measured from surface 172 of TSV interposer 178 to surface 362 of encapsulant 360. Height H3 of encapsulant 360 selected to optimize the silicon to mold ratio in order to minimize warpage caused by CTE mismatch. Therefore, height H3 of encapsulant 360 provides structural support and minimizes warpage during the BVR process. In one embodiment, height H3 is less than a height of semiconductor die 124 together with conductive pillars 158 and bumps 160.

After the BVR process, TSV interposer 178 has a reduced thickness. Encapsulant 360 also has a reduced total thickness, measured from surface 362 to new surface 372. Although a total thickness of encapsulant 360 is reduced, the height H3 of encapsulant 360 over TSV interposer 178 remains the same. In one embodiment, height H3 of encapsulant 360 over TSV interposer 178 is less than 530 µm. Encapsulant 360 with height H3 has a sufficient thickness to support reconstituted wafer 350 during subsequent processing steps, including formation of a build-up interconnect structure.

Figure 8D:
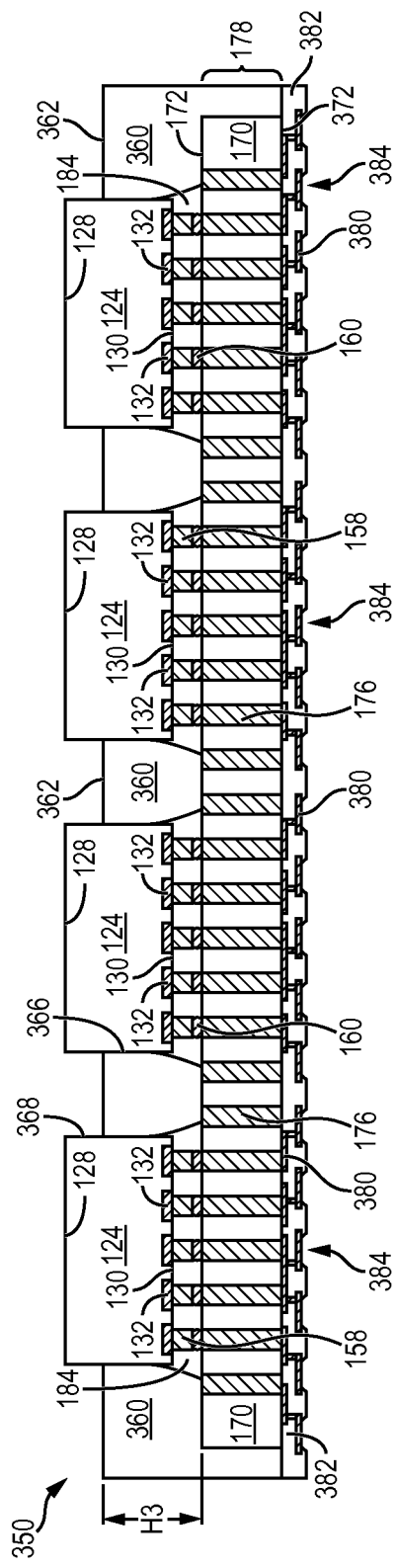

In FIG. 8d, an electrically conductive layer or RDL 380 is formed over surface 372 of TSV interposer 178 using a patterning and metal deposition process such as sputtering, electrolytic plating, and electroless plating. Conductive layer 380 can be one or more layers of Al, Cu, Sn, Ti, Ni, Au, Ag, W, or other suitable electrically conductive material. A portion of conductive layer 380 is electrically connected to conductive TSV 176. Other portions of conductive layer 380 can be electrically common or electrically isolated depending on the design and function of semiconductor die 124.

An insulating layer 382 is formed over surface 372 of TSV interposer 178 opposite semiconductor die 124. Insulating layer 382 is formed around and between conductive layers 380 using PVD, CVD, printing, lamination, spin coating, spray coating, sintering or thermal oxidation. Insulating layer 382 contains one or more layers of SiO2, Si3N4, SiON, Ta2O5, Al2O3, or other material having similar insulating and structural properties. A portion of insulating layer 382 is removed by an etching process or LDA to form openings 384 and to expose conductive layer 380.

Figure 8E:
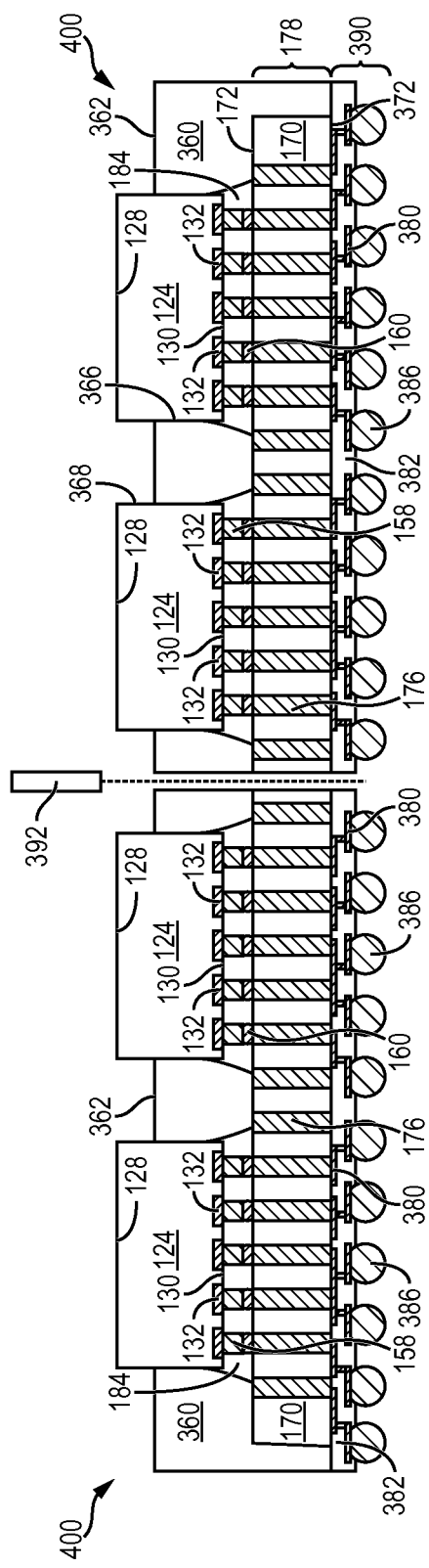

In FIG. 8e, an electrically conductive bump material is deposited over conductive layer 380 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 380 using a suitable attachment or bonding process. In one embodiment, the bump material is reflowed by heating the material above the material's melting point to form spherical balls or bumps 386. In some applications, bumps 386 are reflowed a second time to improve electrical contact to conductive layer 380. Bumps 386 can also be compression bonded to conductive layer 380. Bumps 386 represent one type of interconnect structure that can be formed over conductive layer 380. The interconnect structure can also use stud bump, micro bump, or other electrical interconnect.

Collectively, insulating layers 382, conductive layer 380, and bumps 386 constitute a build-up interconnect structure 390 formed over surface 372 of TSV interposer 178. Build-up interconnect structure 390 may include as few as one RDL or conductive layer, such as conductive layer 380, and one insulating layer, such as insulating layer 382. Additional insulating layers and RDLs can be formed over insulating layer 382 prior to forming bumps 386, to provide additional vertical and horizontal electrical connectivity across the package according to the design and functionality of semiconductor die 124.

Reconstituted wafer 350 is singulated with saw blade or laser cutting tool 392 into individual semiconductor packages 400. Reconstituted wafer 400 is singulated through encapsulant 360 and base substrate material 170 of TSV interposer 178.

Figure 9:
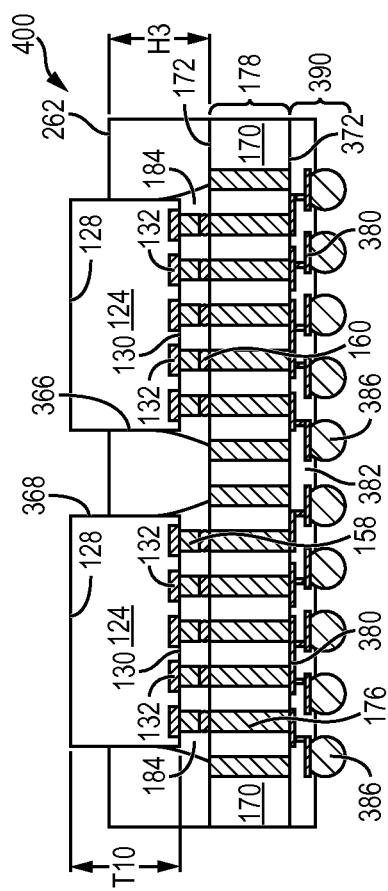
FIG. 9 illustrates another semiconductor device having reduced warpage.

FIG. 9 shows a semiconductor package 400 after singulation. Semiconductor die 124 is disposed over TSV interposer 178 with conductive pillars 158, and bumps 160 oriented toward TSV interposer 178. In one embodiment, two or more semiconductor die 124 are disposed side-by-side over TSV interposer 178 to form a 2.5D semiconductor package. 2.5D packaging technologies provide greater device integration and smaller profile packages with electrical interconnection between adjacent semiconductor die 124 facilitated by TSV interposer 178. Additional semiconductor die or components 124 may be mounted adjacent to semiconductor die 124 and over TSV interposer 178. Semiconductor die 124 within semiconductor package 400 may be similar or different in size or shape than adjacent semiconductor die 124. Conductive pillars 158 and bumps 160 are electrically connected to conductive TSV 176. TSV interposer 178 routes electrical signals between semiconductor die 124 and build-up interconnect structure 390. Build-up interconnect structure 390 provides vertical electrical interconnection to external devices, for example a PCB.

Encapsulant 360 is disposed over and around semiconductor die 124 and TSV interposer 178. Encapsulant 360 provides structural support during the manufacturing of semiconductor packages 400. In particular, encapsulant 360 supports reconstituted wafer 350 during the BVR process and during formation of build-up interconnect structure 390. Therefore, semiconductor packages 330 can be handled and processed without a temporary carrier. Semiconductor packages 400 are produced more cost-effectively without the expensive process of temporary bonding to a carrier and subsequently debonding from the carrier. Elimination of the temporary carrier bonding and debonding steps substantially reduces the cost of manufacturing semiconductor packages 330.

Additionally, the silicon to mold ratio within reconstituted wafer 350 improves the thermal performance and electrical reliability of semiconductor packages 400. The amount of encapsulant 360 disposed over semiconductor die 124 and TSV interposer 178 is selected in order to minimize warpage while providing structural support. The silicon to mold ratio of reconstituted wafer 350 reduces warpage of reconstituted wafer 350 and improves the reliability of electrical connections within semiconductor package 400. The silicon to mold ratio also ensures a sufficient stiffness and support for TSV interposer 178 before and after the BVR process. Accordingly, semiconductor package 400 provides a cost efficient device with improved thermal performance and reliability.

While one or more embodiments of the present invention have been illustrated in detail, the skilled artisan will appreciate that modifications and adaptations to the embodiments may be made without departing from the scope of the present invention as set forth in the following claims.

What is claimed:

1. A method of making a semiconductor device, comprising:
providing a substrate;
disposing a plurality of semiconductor die over the substrate;
determining a ratio of an encapsulant to a quantity of the semiconductor die for providing structural support for the semiconductor die;
depositing the encapsulant over the semiconductor die and substrate, wherein an amount of the encapsulant is selected according to the determined ratio; and
removing a portion of the substrate.

2. The method of claim 1, further including removing a portion of the encapsulant in a peripheral region of the semiconductor die.

3. The method of claim 2, wherein removing the portion of the encapsulant further includes forming channels in the encapsulant.

4. The method of claim 3, further including singulating through the channels to remove the channels.

5. The method of claim 1, further including forming a plurality of conductive vias partially through a first surface of the substrate.

6. The method of claim 5, wherein removing the portion of the substrate further includes removing the portion of the substrate from a second surface of the substrate opposite the first surface to expose the conductive vias.

7. A method of making a semiconductor device, comprising:
providing a substrate including a base substrate material;
disposing a semiconductor die including a base semiconductor material over the substrate;
depositing an encapsulant around the semiconductor die, wherein an amount of the encapsulant is selected based on a total amount of the base substrate material and base semiconductor material; and
removing a portion of the substrate.

8. The method of claim 7, further including depositing the encapsulant while leaving a portion of a side surface of the semiconductor die exposed with respect to the encapsulant.

9. The method of claim 7, further including removing a portion of the encapsulant to expose a side surface of the semiconductor die.

10. The method of claim 7, further including removing a portion of the encapsulant to form a channel in the encapsulant in a peripheral region of the semiconductor die.

11. The method of claim 10, further including singulating through the channel to remove the channel.

12. The method of claim 7, further including:
depositing the encapsulant over the semiconductor die; and
removing a portion of the encapsulant from over a surface of the semiconductor die.

13. The method of claim 7, further including:
forming a plurality of conductive vias partially through a first surface of the substrate; and
removing the portion of the substrate to expose the conductive vias.

14. A method of making a semiconductor device, comprising:
providing a substrate including a base substrate material;
disposing a semiconductor die including a base semiconductor material over the substrate;
depositing an encapsulant over the semiconductor die; and
removing a portion of the encapsulant to reduce a volume of encapsulant based on a total amount of the base substrate material and base semiconductor material.

15. The method of claim 14, further including forming a channel in the encapsulant outside a footprint of the semiconductor die.

16. The method of claim 15, further including singulating through the channel to remove the channel.

17. The method of claim 15, further including forming the channel by patterning, wet etching, sand blasting, sawing, or laser cutting.

18. The method of claim 14, further including removing a portion of the substrate after removing the portion of the encapsulant.

19. The method of claim 14, further including forming an interconnect structure over a surface of the substrate opposite the semiconductor die.

20. A method of making a semiconductor device, comprising:

providing a substrate including a base substrate material;
disposing a semiconductor die including a base semiconductor material over the substrate; and
depositing an encapsulant around the semiconductor die, wherein an amount of the encapsulant is selected based on a total amount of the base substrate material and base semiconductor material.

21. The method of claim 20, further including removing a portion of the encapsulant in a peripheral region of the semiconductor die.

22. The method of claim 21, wherein removing the portion of the encapsulant further includes forming a channel in the encapsulant.

23. The method of claim 22, further including forming the channel by patterning, wet etching, sand blasting, sawing, or laser cutting.

24. The method of claim 22, further including singulating through the channel to remove the channel.

25. The method of claim 22, further including removing a portion of the substrate after forming the channel.

* * * * *